US012622137B2

(12) United States Patent
Im et al.

(10) Patent No.: US 12,622,137 B2
(45) Date of Patent: May 5, 2026

(54) DISPLAY DEVICE AND ELECTRONIC DEVICE HAVING THE SAME

(71) Applicant: Samsung Display Co., LTD., Yongin-si (KR)

(72) Inventors: Choong Youl Im, Yongin-si (KR); Ha Seok Jeon, Yongin-si (KR); Hyun Duck Cho, Yongin-si (KR); Beohm Rock Choi, Yongin-si (KR)

(73) Assignee: Samsung Display Co., LTD., Yongin-si (KR)

( * ) Notice: Subject to any disclaimer, the term of this patent is extended or adjusted under 35 U.S.C. 154(b) by 412 days.

(21) Appl. No.: 18/335,316

(22) Filed: Jun. 15, 2023

(65) Prior Publication Data

US 2024/0164146 A1 May 16, 2024

(30) Foreign Application Priority Data

Nov. 11, 2022 (KR) ........................ 10-2022-0151009

(51) Int. Cl.
| | |
|---|---|
| *H10K 59/122* | (2023.01) |
| *H10K 59/38* | (2023.01) |
| *H10K 59/40* | (2023.01) |
| *H10K 59/80* | (2023.01) |
| *H10K 102/00* | (2023.01) |

(52) U.S. Cl.
CPC ........... *H10K 59/122* (2023.02); *H10K 59/38* (2023.02); *H10K 59/40* (2023.02); *H10K 59/873* (2023.02); *H10K 59/8792* (2023.02); *H10K 2102/311* (2023.02); *H10K 2102/351* (2023.02)

(58) Field of Classification Search
CPC .... H10K 59/122; H10K 59/40; H10K 59/873; H10K 59/38; H10K 59/8792; H10K 2102/311; H10K 2102/351
See application file for complete search history.

(56) References Cited

U.S. PATENT DOCUMENTS

| | | | |
|---|---|---|---|
| 10,761,664 B2 | 9/2020 | Kwon et al. | |
| 11,895,895 B2 | 2/2024 | Lee et al. | |
| 2019/0206945 A1* | 7/2019 | Lin ..................... H10F 39/8053 | |
| 2023/0413651 A1 | 12/2023 | Jeon et al. | |
| 2024/0107852 A1 | 3/2024 | Lee et al. | |

FOREIGN PATENT DOCUMENTS

| | | |
|---|---|---|
| EP | 4 016 636 | 6/2022 |
| KR | 10-2017-0136108 | 12/2017 |
| KR | 10-2022-0058716 | 5/2022 |
| KR | 10-2022-0086771 | 6/2022 |
| KR | 10-2022-0125902 | 9/2022 |

OTHER PUBLICATIONS

Extended European Search Report for European Application No. 23200599.1, dated Mar. 27, 2024.

* cited by examiner

*Primary Examiner* — Anne M Hines
(74) *Attorney, Agent, or Firm* — F. CHAU & ASSOCIATES, LLC

(57) ABSTRACT

A display device includes a first electrode disposed on a substrate; a pixel defining layer that has an opening exposing the first electrode; a second electrode disposed on the pixel defining layer and the first electrode; an encapsulation layer that covers the second electrode; a color filter disposed on the encapsulation layer; and an upper light blocking layer that has an upper opening corresponding to the color filter, wherein the upper light blocking layer overlaps an overlapping portion where adjacent color filters overlap each other in a plan view.

20 Claims, 22 Drawing Sheets

EA3 : SEA1, SEA2

EA3 : SEA1, SEA2

EA3 : SEA1, SEA2

| | Comparative Example 1 | Example 1 | Example 1 + Increase in thickness | Example 3 | Example 3 + Increase in thickness |
|---|---|---|---|---|---|
| Cross-sectional structure | | | | | |
| Within 1 m | | | | | |
| 30cm | | | | | |

CF2     CF3

BM

TFEL

PDL

FIG. 18

| R → G → B | R → B → G | Reflectance reducing effect |
|---|---|---|
| | | SCI : 6.42 → 6.38%<br>SCE : 0.69 → 0.65% |
| | | SCI : 6.49 → 6.43%<br>SCE : 0.65 → 0.59% |

EA3 : SEA1, SEA2

DISPLAY DEVICE AND ELECTRONIC DEVICE HAVING THE SAME

CROSS-REFERENCE TO RELATED APPLICATION

This application claims priority to and the benefit of Korean Patent Application No. 10-2022-0151009 under 35 U.S.C. § 119, filed in the Korean Intellectual Property Office (KIPO) on Nov. 11, 2022, the entire contents of which are incorporated herein by reference.

BACKGROUND

1. Technical Field

Embodiments of the disclosure relate to a display device and an electronic device including the same.

2. Description of the Related Art

A display device serves to display an image, and includes a liquid crystal display, an organic light emitting diode display, and the like. Such a display device is used in various electronic devices such as mobile phones, navigation units, digital cameras, electronic books, portable game machines, and various terminals.

A display device such as an organic light emitting diode display may have a structure in which the display device can be bent or folded using a flexible substrate.

An emissive display device is a self-emitting display device and displays an image by emitting light from a light emitting element.

On the other hand, the liquid crystal display displays an image by adjusting a degree of blocking light provided by a light unit, and two polarizers are formed on top and bottom as well as on a liquid crystal layer to block light.

Accordingly, an emissive display device may generally display an image without including a polarizer unlike a liquid crystal display.

The above information disclosed in this Background section is only for enhancement of understanding of the background of the described technology, and therefore, it may contain information that does not form the prior art that is already known in this country to a person of ordinary skill in the art.

SUMMARY

Embodiments have been made in an effort to reduce undesirable reflection, e.g., a reflection diffraction pattern or reflective diffraction pattern generated in case that external light is reflected.

The technical objectives to be achieved by the disclosure are not limited to those described herein, and other technical objectives that are not mentioned herein would be clearly understood by a person skilled in the art from the description of the disclosure.

An embodiment of the disclosure provides a display device including a first electrode positioned on a substrate; a pixel defining layer that has an opening exposing the first electrode; a second electrode disposed on the pixel defining layer and the first electrode; an encapsulation layer that covers the second electrode; a color filter disposed on the encapsulation layer; and an upper light blocking layer that has an upper opening corresponding to the color filter, wherein the upper light blocking layer overlaps an overlapping portion where adjacent color filters overlap each other in a plan view, and a horizontal distance between the pixel defining layer and the upper light blocking layer is in a range of about 6 μm to about 8.5 μm.

The display device may further include a lower light blocking layer disposed on the encapsulation layer and having a lower opening, the lower opening may be filled by the color filter, and a horizontal distance between the lower light blocking layer and the upper light blocking layer may be in a range of about 1.7 μm to about 3 μm.

The lower opening may have a smaller area than the upper opening.

The upper light blocking layer may have a thickness in a range of about 1 μm to about 3 μm, and the lower light blocking layer may have a thickness in a range of about 1 μm to about 1.5 μm.

A horizontal distance between the pixel defining layer and the lower light blocking layer may be in a range of about 3 μm to about 6.8 μm.

The lower opening and the upper opening may each have a circular shape.

The upper light blocking layer may be formed along the overlapping portion where the adjacent color filters overlap each other in a plan view.

The upper light blocking layer may have a constant width.

An embodiment of the disclosure provides a display device including a first electrode positioned on a substrate; a pixel defining layer that has an opening exposing the first electrode; a second electrode disposed on the pixel defining layer and the first electrode; an encapsulation layer that covers the second electrode; a lower light blocking layer disposed on the encapsulation layer and having a lower opening; and a color filter that fills the lower opening, wherein adjacent color filters do not overlap each other in a plan view and are spaced apart at regular intervals, and a horizontal distance between the pixel defining layer and the upper light blocking layer is in a range of about 6 μm to about 8.5 μm.

Portions at which the adjacent color filters spaced apart at the regular intervals may overlap the lower light blocking layer in a plan view.

The lower light blocking layer may be formed to have a thickness in a range of about 1 μm to about 3 μm.

An embodiment provides an electronic device including a housing that has a rear surface and a side surface; a cover window disposed at an upper portion of the housing; and a display panel disposed at a lower portion of the cover window and including a display area, wherein the display panel includes a first electrode positioned on a substrate; a pixel defining layer that has an opening exposing the first electrode; a second electrode disposed on the pixel defining layer and the first electrode; an encapsulation layer that covers the second electrode; a lower light blocking layer disposed on the encapsulation layer and having a lower opening; a color filter that fills the lower opening; and an upper light blocking layer that has an upper opening corresponding to the color filter, wherein a horizontal distance between the lower light blocking layer and the upper light blocking layer is in a range of about 1.7 μm to about 3 μm.

A horizontal distance between the pixel defining layer and the upper light blocking layer may be in a range of about 6 μm to about 8.5 μm, and a horizontal distance between the pixel defining layer and the lower light blocking layer may be in a range of about 3 μm to about 6.8 μm.

The lower opening may have a smaller area than the upper opening.

The upper light blocking layer may have a thickness in a range of about 1 µm to about 3 µm, and the lower light blocking layer may have a thickness in a range of about 1 µm to about 1.5 µm.

The lower opening and the upper opening may each have a circular shape.

The upper opening may be formed along an overlapping portion where adjacent color filters overlap in a plan view.

The upper opening may have a constant width.

A polarizer may not be disposed on a front surface of the display panel.

The display panel may include a sensing electrode disposed between the encapsulation layer and the lower light blocking layer and overlapping the lower light blocking layer in a plan view, and a touch sensing layer that includes a sensing insulating layer disposed on at least one side of the sensing electrode.

According to the embodiments, in order to eliminate a reflection problem of external light caused by not positioning a polarizer on the front surface, reflection of external light may be reduced by forming a color filter and a light blocking layer instead of a polarizer on the front surface of the emissive display device, and a reflection diffraction pattern generated by reflection of external light may also be reduced.

According to the embodiments, it is possible to reduce the scattering and reflection occurring at the overlapping portion where the adjacent color filters overlap and to reduce the reflection diffraction pattern by forming a light blocking layer on the color filter as a front surface of the light emitting display, and covering a level difference caused by the overlapping of the adjacent color filters with a light blocking layer.

According to the embodiments, it is possible to reduce the scattering and reflection generated in the overlapping portion of the color filter and to reduce the reflection diffraction pattern by forming the adjacent color filters not to overlap each other such that overlapping portions of color filters are not formed and by positioning the light blocking layer between the adjacent color filters.

BRIEF DESCRIPTION OF THE DRAWINGS

FIG. 13 illustrates a table comparing reflection characteristics of emissive display devices according to a comparative example and an example.

FIG. 15 illustrates a table comparing reflection characteristics of emissive display devices according to a comparative example and an example.

FIG. 17 and FIG. 18 each illustrate a comparison of differences in reflection characteristics depending on a stacked order of color filters in an emissive display device according to an embodiment.

DETAILED DESCRIPTION OF THE EMBODIMENTS

Figure 1:
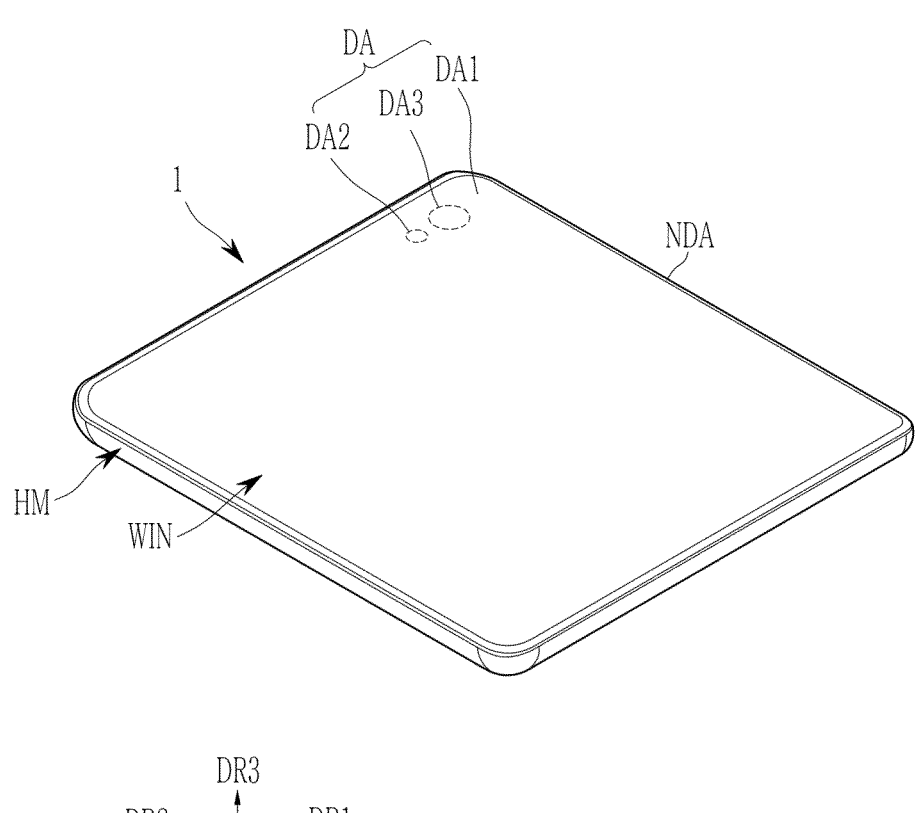
FIG. 1 illustrates a schematic perspective view of an electronic device according to an embodiment.

The disclosure will be described more fully hereinafter with reference to the accompanying drawings, in which embodiments of the disclosure are shown. As those skilled in the art would realize, the described embodiments may be modified in various different ways, all without departing from the spirit or scope of the disclosure.

To concisely describe the disclosure, parts that are irrelevant to the description may be omitted, and like reference numerals and/or reference characters refer to like or similar constituent elements throughout the specification.

Further, since sizes and thicknesses of constituent members shown in the accompanying drawings may be arbitrarily given for better understanding and ease of description, the disclosure is not limited to the illustrated sizes and thicknesses. In the drawings, the thicknesses of layers, films, panels, regions, etc., may be exaggerated for clarity. In the drawings, for better understanding and ease of description, the thicknesses of some layers and areas may be exaggerated.

It will be understood that when an element such as a layer, film, region, plate, constitute elements, etc. is referred to as being "on" another element, it can be directly on the other element or intervening elements may also be present. In contrast, when an element is referred to as being "directly on" another element, there are no intervening elements present. Further, in the specification, the word "on" or "above" means positioned on or below the object portion, and does not necessarily mean positioned on the upper side of the object portion based on a gravitational direction.

In addition, unless explicitly described to the contrary, the words "comprise" "include," "have" and variations thereof such as "comprises" or "comprising" will be understood to imply the inclusion of stated elements but not the exclusion of any other elements.

Further, throughout the specification, the phrase "in a plan view" means when an object portion is viewed from above, and the phrase "in a cross-sectional view" means when a cross-section taken by vertically cutting an object portion is viewed from the side.

When an element is referred to as being "connected to" or "coupled to" another element, it may be connected to, or coupled to the other element or intervening elements or layers may be present. When, however, an element is referred to as being "directly connected to," or "directly coupled to" another element, there are no intervening elements or layers present. To this end, the term "connected" may refer to physical, electrical, and/or fluid connection, with or without intervening elements.

In addition, throughout the specification, when it is said that a portion of a wire, layer, film, region, plate, component, etc., "extends in a first direction or a second direction," this does not indicate only a straight shape extending straight in the corresponding direction, and indicates a structure that generally extends along the first direction or the second direction, and it includes a structure that is bent at a portion, has a zigzag structure, or extends while including a curved structure.

In addition, an electronic device (e.g., a mobile phone, TV, monitor, notebook computer, etc.) including a display device, a display panel, etc. described in the specification, or an electronic device including a display device and a display panel manufactured by the manufacturing method described in the specification, are not excluded from the scope of the present specification.

The term "and/or" includes all combinations of one or more of which associated configurations may define. For example, "A and/or B" may be understood to mean "A, B, or A and B."

For the purposes of this disclosure, the phrase "at least one of A and B" may be construed as A only, B only, or any combination of A and B. Also, "at least one of X, Y, and Z" and "at least one selected from the group consisting of X, Y, and Z" may be construed as X only, Y only, Z only, or any combination of two or more of X, Y, and Z.

The term "about" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value."

Hereinafter, embodiments will be described with reference to the accompanying drawings.

FIG. 1 illustrates a schematic perspective view of an electronic device according to an embodiment.

Referring to FIG. 1, an electronic device 1, which is an electronic device providing a display screen capable of displaying moving images or still images in a third direction DR3, may include, e.g., a TV, a laptop, a monitor, a billboard, an Internet of things (IoT) device, a mobile phone, a smart phone, a tablet personal computer (PC), an electronic watch, a smart watch, a watch phone, a head-mounted display, a mobile communication terminal, an electronic notebook, an e-book reader, a portable multimedia player (PMP), a navigation system, a game console, a digital camera, a camcorder, etc.

Figure 2:
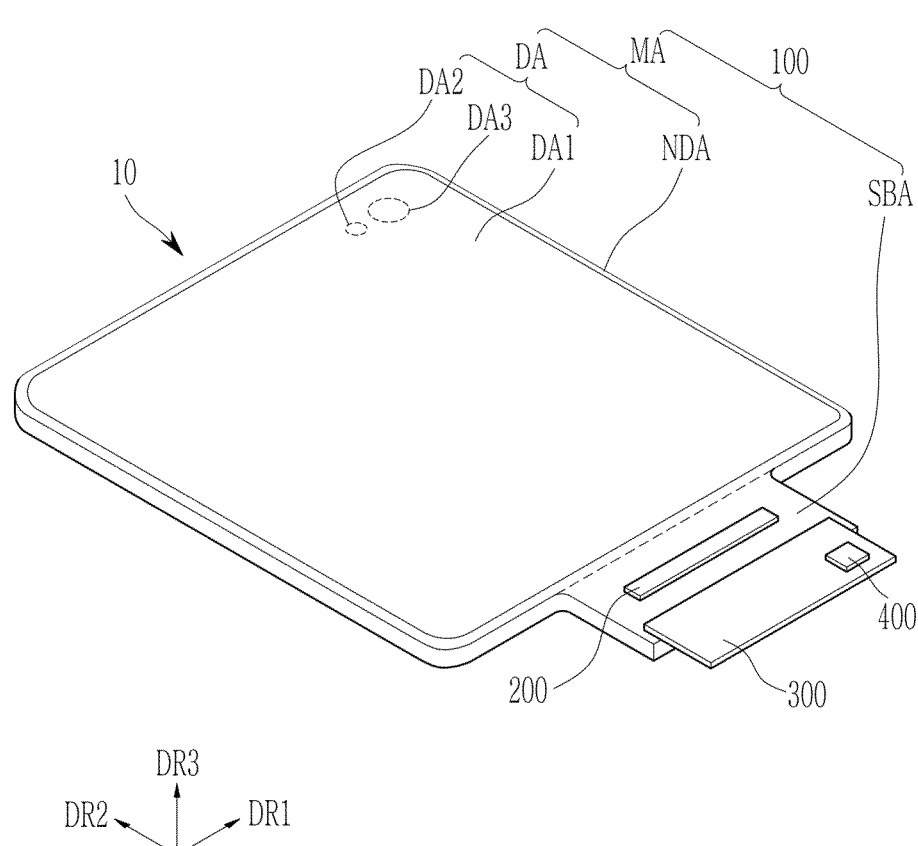
FIG. 2 illustrates a schematic perspective view of an emissive display device included in an electronic device according to an embodiment.

The electronic device 1 may include a cover window WIN and a housing HM, and an emissive display device 10 illustrated in FIG. 2 may be positioned inside the cover window WIN and the housing HM. Accordingly, the cover window WIN and the housing HM may be combined to form an outer appearance of the electronic device 1.

Figure 22:
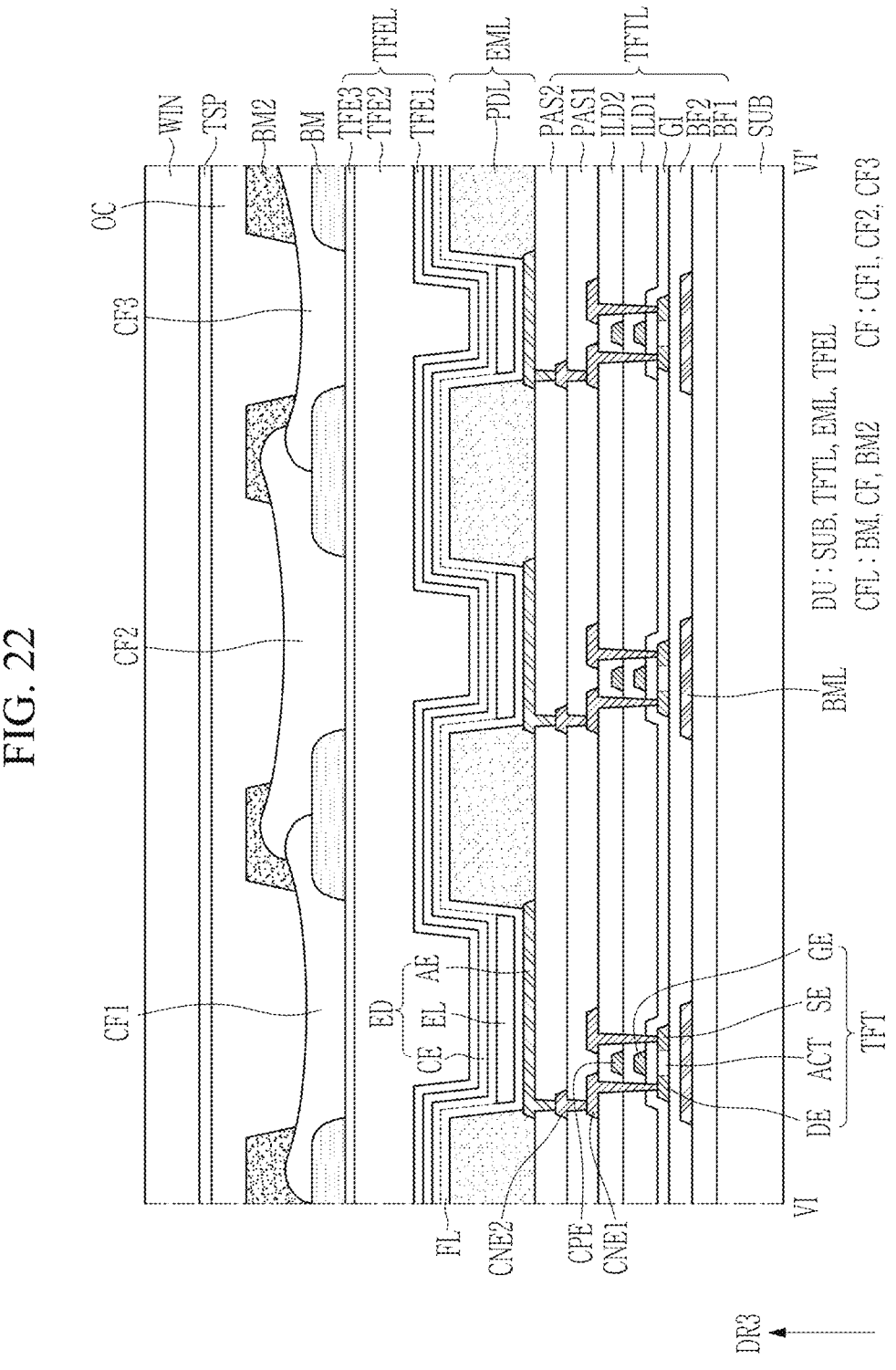

The cover window WIN may include an insulating panel. For example, the cover window WIN may be formed of (or include) glass, plastic, or a combination thereof. Referring to FIG. 22, the cover window WIN may include a touch sensing part capable of sensing a touch.

A front surface of the cover window WIN may define a front surface of the electronic device 1.

The housing HM may be coupled to the cover window WIN. The cover window WIN may be positioned on a front surface of the housing HM. The housing HM may be coupled to the cover window WIN to provide an accommodation space (e.g., a predetermined or selectable accommodation space). The emissive display device 10 may be accommodated in the accommodation space (e.g., a predetermined or selectable accommodation space) provided between the housing HM and the cover window WIN.

The housing HM may include a material having relatively high rigidity. For example, the housing HM may include frames and/or plates made of glass, plastic, metal, or a combination thereof. The housing HM may have a rear surface and a side surface, the cover window WIN may be positioned at an upper portion of the housing HM, and components of the emissive display device 10 accommodated in an inner space formed by the housing HM and the cover window WIN may be stably protected from external impact.

The electronic device 1 may include a display device 10 (see FIG. 2) providing a display screen in the third direction DR3. As the display device included in the electronic device 1, various display devices such as an inorganic light emitting diode display, an organic light emitting diode display, and a quantum dot emissive display device may be used. Hereinafter, a case in which an emissive display device including an organic light emitting element is applied as an example of the display device will be mainly described, but the disclosure is not limited thereto, and when a same technical idea is applicable, it may be applied to another display device as well.

A shape of the electronic device 1 may be variously modified. For example, the electronic device 1 may have a shape such as a horizontally long rectangle, a vertically long rectangle, a square, a rectangle with rounded corners, other polygons, or a circle. A shape of a display area DA of the electronic device 1 may also be similar to an overall shape of the electronic device 1. In FIG. 1, the electronic device 1 having a relatively long rectangular shape in a first direction DR1 is illustrated as an example, but is not limited thereto. The electronic device 1 may include a display area DA and a non-display area NDA.

The display area DA and the non-display area NDA illustrated in FIG. 1 may correspond to the display area DA and the non-display area NDA of the emissive display device 10. The display area DA may be an area in which an image is displayed, and the non-display area NDA may be an area in which an image is not displayed. The display area DA may occupy most of an area around a center of the electronic device 1, and the non-display area NDA may have a structure surrounding the display area DA.

The display area DA may include a first display area DA1, a second display area DA2, and a third display area DA3. The second display area DA2 and the third display area DA3, which are areas in which a component such as a sensor or a camera for adding various functions to the electronic device 1 is positioned on a rear surface (a surface positioned below in the third direction DR3) thereof, may correspond to component areas. The second display area DA2 and the third display area DA3 may be surrounded by the first display area DA1. In addition to the first display area DA1, the second display area DA2 and the third display area DA3 may display images. Positions and numbers of the second display area DA2 and the third display area DA3 may be variously changed according to another embodiment.

Hereinafter, a structure of an emissive display device, which is an example of a display device, will be described with reference to FIG. 2.

FIG. 2 illustrates a schematic perspective view of an emissive display device included in an electronic device according to an embodiment.

Referring to FIG. 2, the display device 1 according to an embodiment may include an emissive display device 10. The emissive display device 10 may serve to display an image on the electronic device 1, and may detect or photograph a front surface of the electronic device 1. The emissive display device 10 may have a flat shape similar to that of the electronic device 1. For example, the emissive display device 10 may have a shape similar to a quadrangle having a side in the first direction DR1 and a side in the second direction DR2. A corner where the side in the first direction DR1 and the side in the second direction DR2 meet may be formed round to have a curvature, but may be formed at a right angle without being limited thereto. The flat shape of the emissive display device 10 is not limited to a quadrangle, and may be formed similarly to another polygon, a circular shape, or an elliptical shape. The emissive display device 10 may include a display panel 100, a display driver 200, a circuit board 300, and a touch driver 400.

The display panel 100 may include a main area MA and a subarea SBA.

The main area MA may include a display area DA including pixels displaying an image, and a non-display area NDA positioned around the display area DA. The display area DA may include a first display area DA1, a second display area DA2, and a third display area DA3. The second display area DA2 and the third display area DA3 may not only include pixels, but also have components such as sensors or cameras positioned at a lower portion thereof in the third direction DR3, and the second display area DA2 and the third display area DA3 may correspond to component areas.

The display area DA may emit light in the third direction DR3 from emission areas corresponding to the light emitting elements. For example, the display panel 100 may include a pixel circuit part including a transistor and a pixel defining layer including a light emitting element and having an opening defining an emission area of the light emitting element. The light emitting element may include at least one of an organic light emitting diode including an organic light emitting layer, a quantum dot light emitting diode (quantum dot LED) including a quantum dot emission layer, an inorganic light emitting diode (inorganic LED) including an inorganic semiconductor, and a micro LED, but the disclosure is not limited thereto.

The non-display area NDA, which is an area outside the display area DA, may surround the display area DA. The non-display area NDA may be defined as an edge area of the main area MA of the display panel 100. The non-display area NDA may include a gate driver (not illustrated) supplying gate signals to gate lines, and fan outline lines (not illustrated) electrically connecting the display driver 200 and the display area DA.

The subarea SBA may be an area extending from a first side of the main area MA. The subarea SBA may include a flexible material capable of being bent, folded, or rolled. For example, in case that the subarea SBA is bent, the subarea SBA may overlap the main area MA, e.g., in a thickness direction (or third direction DR3). The subarea SBA may include a pad portion electrically connected to the display driver 200 and the circuit board 300. In another embodiment, the subarea SBA may be omitted, and the display driver 200 and the pad portion may be positioned in the non-display area NDA. The display driver 200 may output signals and voltages for driving the display panel 100. The display driver 200 may supply data voltages to data lines. The display driver 200 may supply a power supply voltage to a power line, and may supply a gate control signal to a gate driver. The display driver 200 may be formed as an integrated circuit (IC) and be mounted on the display panel 100 using, e.g., a chip-on-glass (COG) method, a chip-on-plastic (COP) method, or an ultrasonic bonding method. For example, the display driver 200 may be positioned in the subarea SBA, and may overlap the main area MA in the thickness direction (third direction DR3) by bending the subarea SBA. For another example, the display driver 200 may be mounted on the circuit board 300.

The circuit board 300 may be attached to the pad portion of the display panel 100 using an anisotropic conductive film (ACF). Lead lines of the circuit board 300 may be electrically connected to the pad portion of the display panel 100. The circuit board 300 may be a flexible printed circuit board, a printed circuit board, or a flexible film such as a chip-on-film.

The touch driver 400 may be mounted on the circuit board 300. The touch driver 400 may be electrically connected to a touch sensor included in electronic device 1. The touch driver 400 may supply a touch driving signal to sensing electrodes of the touch sensor, and may sense a change in capacitance between the sensing electrodes. For example, the touch driving signal may be a pulse signal having a frequency (e.g., a predetermined or selectable frequency). The touch driver 400 may calculate whether or not an input has been made and input coordinates based on a capacitance variation between the sensing electrodes. The touch driver 400 may be formed as an integrated circuit (IC).

Hereinafter, a cross-sectional structure of the emissive display device 10 will be described with respect to FIG. 3.

Figure 3:
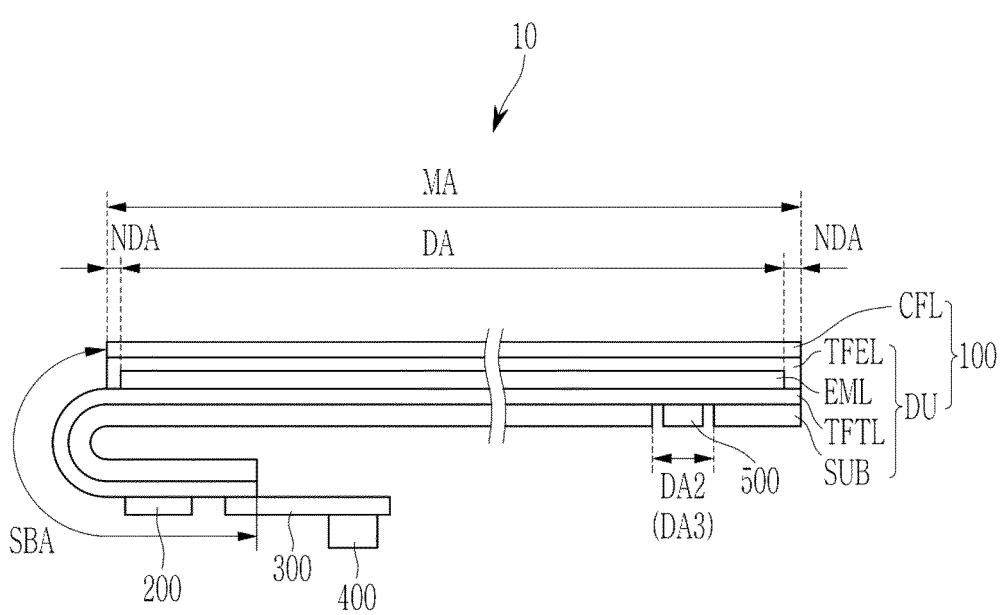
FIG. 3 illustrates a schematic cross-sectional view of the emissive display device of FIG. 2.

FIG. 3 illustrates a schematic cross-sectional view of the emissive display device of FIG. 2.

Referring to FIG. 3, the display panel 100 may include a display layer DU and an external light reducing layer CFL. The display layer DU may include a substrate SUB, a driving element layer TFTL, a light emitting element layer EML, and an encapsulation layer TFEL.

The substrate SUB may be a base substrate or a base layer. The substrate SUB may be a flexible substrate capable of being bent, folded, and/or rolled. For example, the substrate SUB may include a polymer resin such as polyimide (PI), but the disclosure is not limited thereto. In another embodiment, the substrate SUB may include a glass material, a metal material, and the like, or a combination thereof.

The driving element layer TFTL may be disposed on the substrate SUB. The driving element layer TFTL may include transistors and capacitors constituting (or forming) a pixel circuit part that outputs and transfers a current to the light emitting element. The driving element layer TFTL may further include gate lines, data lines, power lines, gate control lines, fan out lines electrically connecting the display driver 200 and the data lines, and lead lines electrically connecting the display driver 200 and the pad portion. Each of the transistors may include a semiconductor including a channel region, a source region, and a drain region, and a gate electrode positioned at a side of the semiconductor. The source region and the drain region of the semiconductor may serve as a source electrode and a drain electrode of each of the transistors, respectively. In case that the gate driver is formed at a first side of the non-display area NDA of the display panel 100, the gate driver may include transistors.

The driving element layer TFTL may be disposed in the display area DA, the non-display area NDA, and the subarea SBA. The transistors, the gate lines, data lines, and power lines of the driving element layer TFTL may be positioned in the display area DA. The gate control lines and the fan out lines of the driving element layer TFTL may be positioned in the non-display area NDA. The lead lines of the driving element layer TFTL may be positioned in the subarea SBA. However, the embodiments are not limited thereto, and various configurations are possible within the technical scope of the disclosure.

In the light emitting element layer EML, a light emitting element and an emission area corresponding to the light emitting element may be positioned, and the light emitting element layer may be positioned on the driving element layer TFTL. The light emitting element layer EML may include light emitting elements including a first electrode, a second electrode, and a light emitting layer that emits light, and a pixel defining layer having an opening defining an emission area. The light emitting elements of the light emitting element layer EML may be positioned in the display area DA.

In an embodiment, the emission layer may be an organic light emitting layer including an organic material. A functional layer including at least one of an electron injection layer, an electron transport layer, a hole transport layer, and a hole injection layer may be positioned at sides (e.g., opposite sides) of the emission layer. Herein, a combination of the emission layer and the functional layer may be referred to as an intermediate layer. In case that first electrode receives a voltage through a transistor of the driving element layer TFTL, and the second electrode receives a driving low voltage, holes and electrons may move to the organic light emitting layer through the hole injection layer and the hole transport layer, and the electron injection layer and the electron transport layer, respectively, and they may be combined with each other in the organic light emitting layer to emit light. One of the first electrode and the second electrode may be an anode, and the other may be a cathode.

In another embodiment, the light emitting element may be a quantum dot light emitting diode including a quantum dot light emitting layer, an inorganic light emitting diode including an inorganic semiconductor, or a micro light emitting diode.

The encapsulation layer TFEL may cover upper and side surfaces of the light emitting element layer EML, and may protect the light emitting element layer EML to prevent external moisture and air from entering it. The encapsulation layer TFEL may include at least one inorganic layer and at least one organic layer for encapsulating the light-emitting element layer EML.

The external light reducing layer CFL may be disposed on the encapsulation layer TFEL. The external light reducing layer CFL may include color filters. The color filers may be disposed in at least some of the emission areas. For example, the color filers may be disposed to correspond to each of emission areas. A light blocking layer may be positioned overlapping the space between adjacent color filters of the external light reducing layer CFL or in an overlapping portion where the adjacent color filters overlap each other. The light blocking layer may be positioned above or below the color filters with respect to the third direction DR3 or may be positioned at opposite sides thereof. A positional relationship between the light blocking layer and the color filters will be described in detail with reference to FIGS. 5 to 20 to be described below.

Since the external light reducing layer CFL is directly disposed on the encapsulation layer TFEL, the emissive display device 10 may not require a separate substrate for the external light reducing layer (CFL). A polarizing plate (or polarizer) may not be attached to an upper portion of the external light reducing layer CFL. As a result, a thickness of the emissive display device 10 may be relatively small. Since the polarizer is not included in the emissive display device 10, while there may be a disadvantage in that external light is reflected as it is, there may be an advantage that reflection of external light is reduced by a color filter or a light blocking layer included in the external light reducing layer CFL. For example, the color filters may selectively transmit light of a specific wavelength, and may block or absorb light of other wavelengths, and the light blocking layer may absorb external light, and thus an amount of external light flowing into the emissive display device 10 may be reduced, and an amount of reflected light may also be reduced, thereby reducing disadvantages caused by reflection of the external light.

According to an embodiment, the emissive display device 10 may further include an optical device 500. The optical device 500 may be positioned on a rear surface in the second display area DA2 or the third display area DA3. The optical device 500 may emit or receive light in infrared, ultraviolet, and visible light bands. For example, the optical device 500 may be an optical sensor that detects light incident on the emissive display device 10, such as a proximity sensor, an illuminance sensor, a camera sensor, or an image sensor.

Hereinafter, a connection relationship of components included in the emissive display device 10 will be described in detail with respect to FIG. 4.

Figure 4:
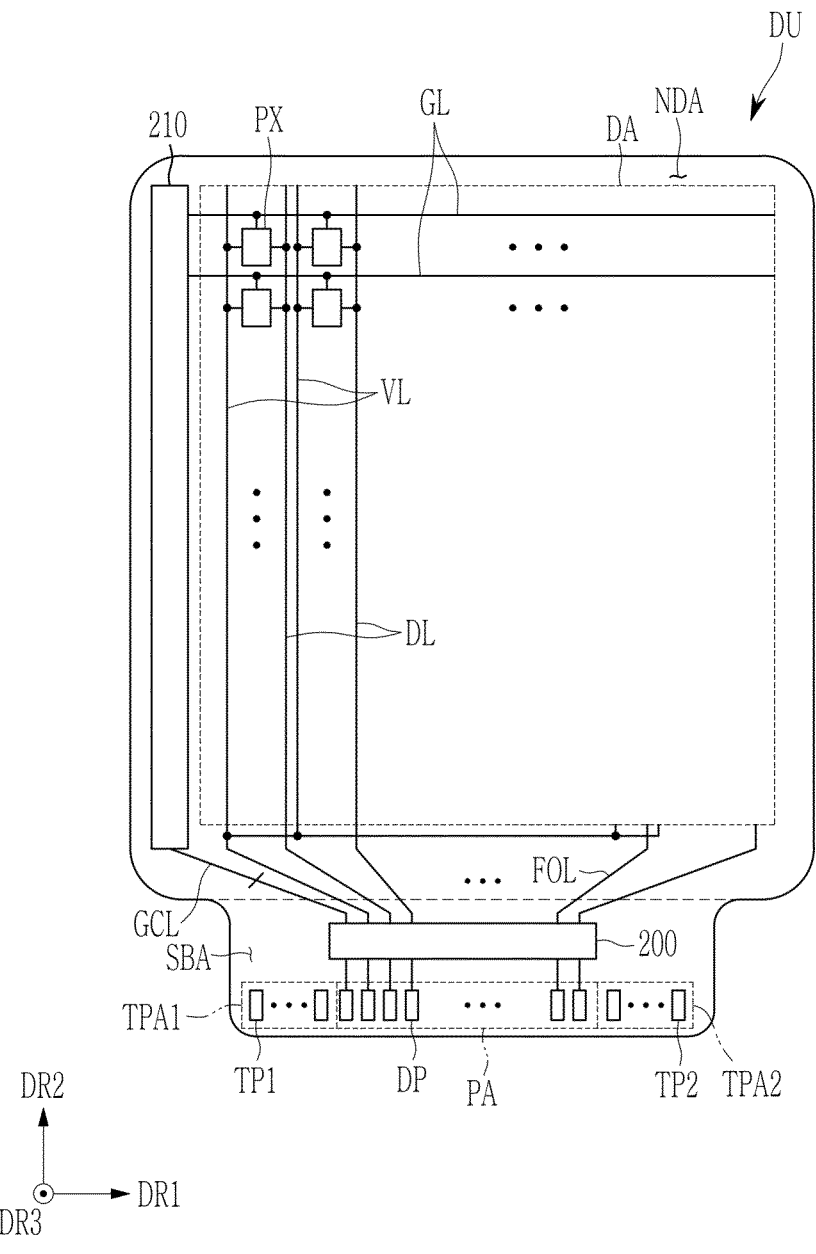
FIG. 4 illustrates a schematic plan view illustrating a connection relationship between components of an emissive display device according to an embodiment.

FIG. 4 illustrates a schematic plan view illustrating a connection relationship between components of an emissive display device according to an embodiment.

Referring to FIG. 4, the display layer DU of the emissive display device 10 may include a display area DA and a non-display area NDA.

The display area DA may be positioned at a center of the display panel 100. Unit pixels PX, gate lines GL, data lines DL, and power lines VL may be positioned in the display area DA. Each of the unit pixels PX, which is a minimum unit that emits light, may include a pixel circuit part including a transistor and a capacitor and a light emitting element that receives a current from the pixel circuit part.

Each of the unit pixels PX may be electrically connected to a gate line GL, a data line DL, and a power line VL, and each of the gate line GL and the power line VL may include lines. The gate lines GL may supply gate signals received from a gate driver 210 to the unit pixels PX. The gate lines GL may extend in the first direction DR1, and may be spaced apart from each other in the second direction DR2 crossing (or intersecting) the first direction DR1.

The data lines DL may supply the data voltages received from the display driver 200 to the unit pixels PX. The data lines DL may extend in the second direction DR2, and may be spaced apart from each other in the first direction DR1.

The power lines VL may supply the power supply voltages received from the display driver 200 to the unit pixels PX. The power supply voltage may be at least one of a driving voltage, an initialization voltage, a reference voltage, and a driving low voltage. Part of the power supply voltages may be transmitted to the unit pixels PX. The power lines VL may extend in the second direction DR2 and may be spaced apart from each other in the first direction DR1.

The non-display area NDA may be positioned to surround a periphery of the display area DA. The gate driver 210, fan out lines FOL, and gate control lines GCL may be positioned in the non-display area NDA.

The gate driver 210 may generate gate signals based on a gate control signal, and may sequentially supply gate signals to the gate lines GL in an order (e.g., a predetermined or selectable order).

The fan out lines FOL may extend from the display driver 200 to the display area DA. The fan out lines FOL may supply the data voltages received from the display driver 200 to the data lines DL.

The gate control lines GCL may extend from the display driver 200 to the gate driver 210. The gate control lines GCL may supply gate control signals received from the display driver 200 to the gate driver 210.

Referring to FIG. 4, the emissive display device 10 may further include a subarea SBA.

The subarea SBA may include the display driver 200, a pad area PA, and first and second touch pad areas TPA1 and TPA2.

The display driver 200 may output signals and voltages for driving the display panel 100 to the fan out lines FOL. The display driver 200 may supply the data voltages to the data lines DL through the fan-out lines FOL. The data voltages may be supplied to the unit pixels PX, and may control luminance of the unit pixels PX. The display driver 200 may supply a gate control signal to the gate driver 210 through the gate control line GCL.

The pad area PA, the first touch pad area TPA1, and the second touch pad area TPA2 may be positioned at edges of the subarea SBA. The pad area PA may include display pad portions DP. The display pad portions DP may be electrically connected to a graphic system through the circuit board 300. The display pad portions DP may receive digital video data by being electrically connected to the circuit board 300 and may supply the digital video data to the display driver 200. The first touch pad area TPA1 and the second touch pad area TPA2 each may include touch pads TP1 and TP2, and may be electrically connected to the touch driver 400 positioned on the circuit board 300 to sense a touch. The pad area PA, the first touch pad area TPA1, and the second touch pad area TPA2 may be electrically connected to the circuit board 300 by using a material such as an anisotropic conductive film or SAP (self-assembly anisotropic conductive paste).

Figure 5:
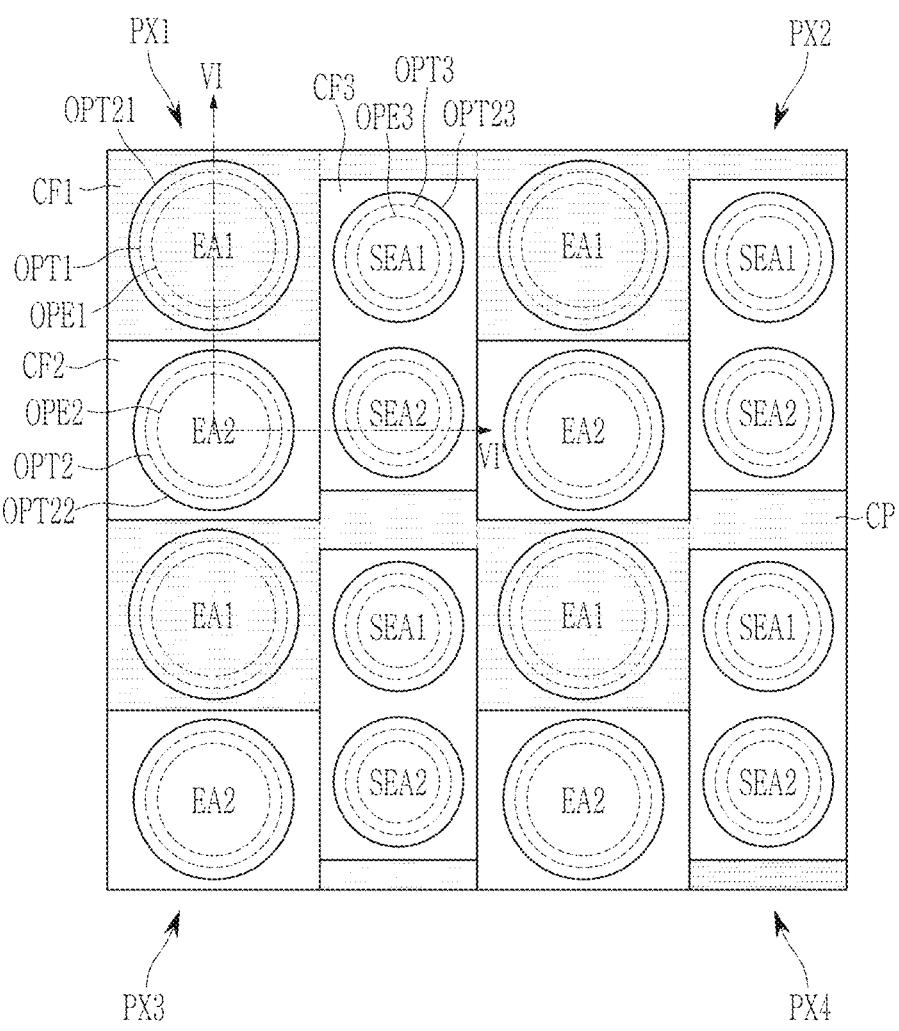
FIG. 5 illustrates a plan view illustrating a disposition of an emission area, a color filter, and a light blocking layer in a display area of an emissive display device according to an embodiment.
Figure 5:
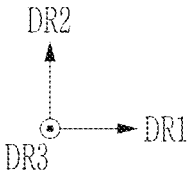

Hereinafter, the positional relationship between an opening of a pixel defining layer positioned on the light emitting element layer EML and a color filter and a light blocking layer positioned on the external light reducing layer CFL will be described with respect to the schematic plan view of FIG. 5. In the embodiment of FIG. 5, a pair of light blocking layers may be formed, and the pair of light blocking layers may be positioned above and below the color filter.

FIG. 5 illustrates a schematic plan view illustrating a disposition of an emission area, a color filter, and a light blocking layer in a display area of an emissive display device according to an embodiment.

FIG. 5 illustrates openings OPE1, OPE2, and OPE3 of the pixel defining layer, openings OPT1, OPT2, and OPT3 of a first light blocking layer (hereinafter also referred to as lower openings), and openings OPT21, OPT22, and OPT23 of a second light blocking layer (hereinafter referred to as upper openings) in a circular shape, and illustrates color filters CF (CF1, CF2, and CF3) separated by straight lines.

The openings OPE1, OPE2, and OPE3 of the pixel defining layer and the openings OPT1, OPT2, and OPT3 of the first light blocking layer may have a circular shape in a plan view, and due to the circular shape, reflected light may be reflected without having a specific direction, thereby reducing reflection characteristics. In case that the flat shape of the openings has a corner, there may be a disadvantage at least in that the reflection is well recognized in a corresponding direction. In contrast, an opening having a circular shape with no corner may have an advantage of having a lowest reflection characteristic.

Referring to FIG. 5, the emissive display device 10 may include unit pixels PX1, PX2, PX3, and PX4 positioned in the display area DA, and emission areas EA1, EA2, and EA3 positioned in each of the unit pixels PX1, PX2, PX3, and PX4. The display area DA illustrated in FIG. 5 may be the first display area DA1, and the unit pixels PX1, PX2, PX3, and PX4 and the emission areas EA1, EA2, and EA3 may be positioned in the first display area DA1. However, the unit pixels PX1, PX2, PX3, and PX4 and the emission areas EA1, EA2, and EA3 may be provided in the second display area DA2 and the third display area DA3 of the display area DA.

The unit pixels PX1, PX2, PX3, and PX4 may include the emission areas EA1, EA2, and EA3 displaying different colors, and may be arranged in the first direction DR1 and the second direction DR2. The first unit pixel PX1 and the second unit pixel PX2 may be positioned adjacent to each other in the first direction DR1, and the first unit pixel PX1 and the third unit pixel PX3 may be positioned adjacent to each other in the second direction DR2. The third unit pixel PX3 and the fourth unit pixel PX4 may be positioned adjacent to each other in the first direction DR1, and the second unit pixel PX2 and the fourth unit pixel PX4 may be positioned adjacent to each other in the second direction DR2. However, a disposition or arrangement of the unit pixels PX1, PX2, PX3, and PX4 is not limited to that illustrated in FIG. 5. According to an embodiment, the unit pixels PX1, PX2, PX3, and PX4 may be positioned in a PENTILE™ type, e.g., a DIAMOND PENTILE™ type.

The emission areas EA1, EA2, and EA3 of each of the unit pixels PX1, PX2, PX3, and PX4 may include a first emission area EA1, a second emission area EA2, and a third emission area EA3 emitting light of different colors. Unlike the first emission area EA1 and the second emission area EA2, the third emission area EA3 may include subemission areas SEA1 and SEA2 spaced apart from each other. The third emission area EA3 may include a first subemission area SEAL and a second subemission area SEA2 spaced apart from the first subemission area SEA2 in the second direction DR2. The first subemission area SEA1 and the second subemission area SEA2 may be structurally separated from each other and emit a same color in a third emission area EA3.

The first to third emission areas EA1, EA2, and EA3 may emit red, green, and blue light, respectively, and a color of light emitted from each of the emission areas EA1, EA2, and EA3 may be different depending on the type of the light emitting layer (or emission layer) EL (see FIG. 6) among light emitting elements (or light emitting diodes) ED (see FIG. 6) positioned in the light emitting element layer EML, which will be described below. In an embodiment, the first emission area EA1 may emit red first light, the second emission area EA2 may emit green second light, and the third emission area EA3 or the subemission areas SEA1 and SEA2 of the third emission area EA3 may emit blue third light.

The emission areas EA1, EA2, and EA3 may have a circular shape in a plan view. However, the disclosure is not limited thereto, but the emission areas EA1, EA2, and EA3 may have a planar structure having no corners, thereby having an advantage of reducing undesirable reflection characteristics. Accordingly, the emission areas EA1, EA2, and EA3 may have an elliptical shape, a circular shape, and/or a shape similar thereto.

The emission areas EA1, EA2, and EA3 within the unit pixels PX1, PX2, PX3, and PX4 may be positioned in the first direction DR1, the second direction DR2, and/or a diagonal direction therebetween. For example, the first emission area EA1 and the second emission area EA2 may be spaced apart from each other in the second direction DR2 within each of the unit pixels PX1, PX2, PX3, and PX4. According to an embodiment, the first emission area EA1 and the second emission area EA2 may be alternately positioned in the second direction DR2 on an entire surface of the display area DA. The first emission area EA1 of the third unit pixel PX3 may be positioned between the second emission area EA2 of the first unit pixel PX1 and the second emission area EA2 of the third unit pixel PX3.

The third emission area EA3 may be spaced apart from the first emission area EA1 and the second emission area EA2 in the first direction DR1 or in a diagonal direction within each of the unit pixels PX1, PX2, PX3, and PX4. The third emission area EA3 may have a shorter length than a length in the second direction DR2 that the first emission area EA1 and the second emission area EA2 have together. In the embodiment of FIG. 5, the third emission area EA3 may be positioned at opposite sides of a center of lengths of the first emission area EA1 and the second emission area EA2 in the second direction DR2, and a color pattern CP may be positioned at opposite sides of the third emission area EA3 in the second direction DR2. The color pattern CP may protrude from the first color filter CF1 in the first direction DR1, may include a same material as the first color filter CF1, and may be a portion integrated with (or integral with) the first color filter CF1.

A disposition of the subemission areas SEA1 and SEA2 of the third emission area EA3 may be different for each of the unit pixels PX1, PX2, PX3, and PX4. For example, in the first unit pixel PX1 and the fourth unit pixel PX4, the first subemission area SEA1 may be positioned adjacent to the first emission area EA1 and spaced apart from the first emission area EA1 and the second emission area EA2 in a diagonal direction. The second subemission area SEA2 may be positioned to be spaced apart from the second emission area EA2 in the first direction DR1. On the other hand, in the second unit pixel PX2 and the third unit pixel PX3, the first subemission area SEA1 may be positioned to be spaced apart from the first emission area EA1 in the first direction DR1. The second subemission area SEA2 may be spaced apart from the first emission area EA1 and the second emission area EA2 in a diagonal direction and may be disposed adjacent to the second emission area EA2. A difference in a disposition of the third emission area EA3 in the different unit pixels PX1, PX2, PX3, and PX4 may depend on (or may be associated with) a disposition of the color filters CF1, CF2, and CF3 and the color pattern CP.

Third emission areas EA3 or the subemission areas SEA1 and SEA2 of the third emission areas EA3 may be repeatedly positioned in the second direction DR2. For example, a pair of first and second subemission areas SEA1 and SEA2 may be repeatedly positioned in the second direction DR2 on an entire surface of the display area DA. According to an embodiment, the first subemission area SEA1 and the second subemission area SEA2 may be alternately and repeatedly positioned in the second direction DR2. The pair of first and second subemission areas SEA1 and SEA2 may be positioned between the first emission area EA1 or the second emission area EA2 of two different unit pixels PX1, PX2, PX3, and PX4. The third emission area EA3 of the first unit pixel PX1 may be positioned between the first emission area EA1 and the second emission area EA2 of the first unit pixel PX1, and the first emission area EA1 and the second emission area EA2 of the second unit pixel PX2.

However, a disposition of the emission areas EA1, EA2, and EA3 is not limited to that illustrated in FIG. 5. Similar to the unit pixels PX1, PX2, PX3, and PX4, the emission areas EA1, EA2, and EA3 may be positioned in a PEN-TILE™ type, e.g., a DIAMOND PENTILE™ type.

The first to third emission areas EA1, EA2, and EA3 may each be defined by the openings OPE1, OPE2, and OPE3 formed in a pixel defining layer PDL (see FIG. 6) of the light emitting element layer EML. For example, the first emission area EA1 may be defined by the first opening OPE1 (see FIG. 6) of the pixel defining layer, the second emission area EA2 may be defined by the second opening OPE2 (see FIG. 6) of the pixel defining layer, and the third emission area EA3 may be defined by the third opening OPE3 (see FIG. 6) of the pixel defining layer.

In an embodiment, an area or size of the first to third emission areas EA1, EA2, and EA3 may be different from each other. In the embodiment of FIG. 5, an area of the first emission area EA1 may be larger than that of each of the subemission areas SEA1 and SEA2 of the second emission area EA2 and the third emission area EA3, and an area of the second emission area EA2 may be larger than that of each of the sub emission areas SEA1 and SEA2 of the third emission area EA3. The areas of the emission areas EA1, EA2, and EA3 may vary depending on sizes of the openings OPE1, OPE2, and OPE3 formed in the pixel defining layer PDL. Intensity of light emitted from the corresponding emission areas EA1, EA2, and EA3 may vary depending on the areas of the emission areas EA1, EA2, and EA3, and color sense of an image displayed on the emissive display device 10 or the electronic device 1 may be controlled by adjusting the areas of the emission areas EA1, EA2, and EA3. The areas of the emission areas EA1, EA2, and EA3 may be related to light efficiency and a lifespan of the light emitting diode ED, and may have a trade-off relationship with reflection by external light. The areas of the emission areas EA1, EA2, and EA3 may be adjusted in consideration of the above matters.

Figure 6:
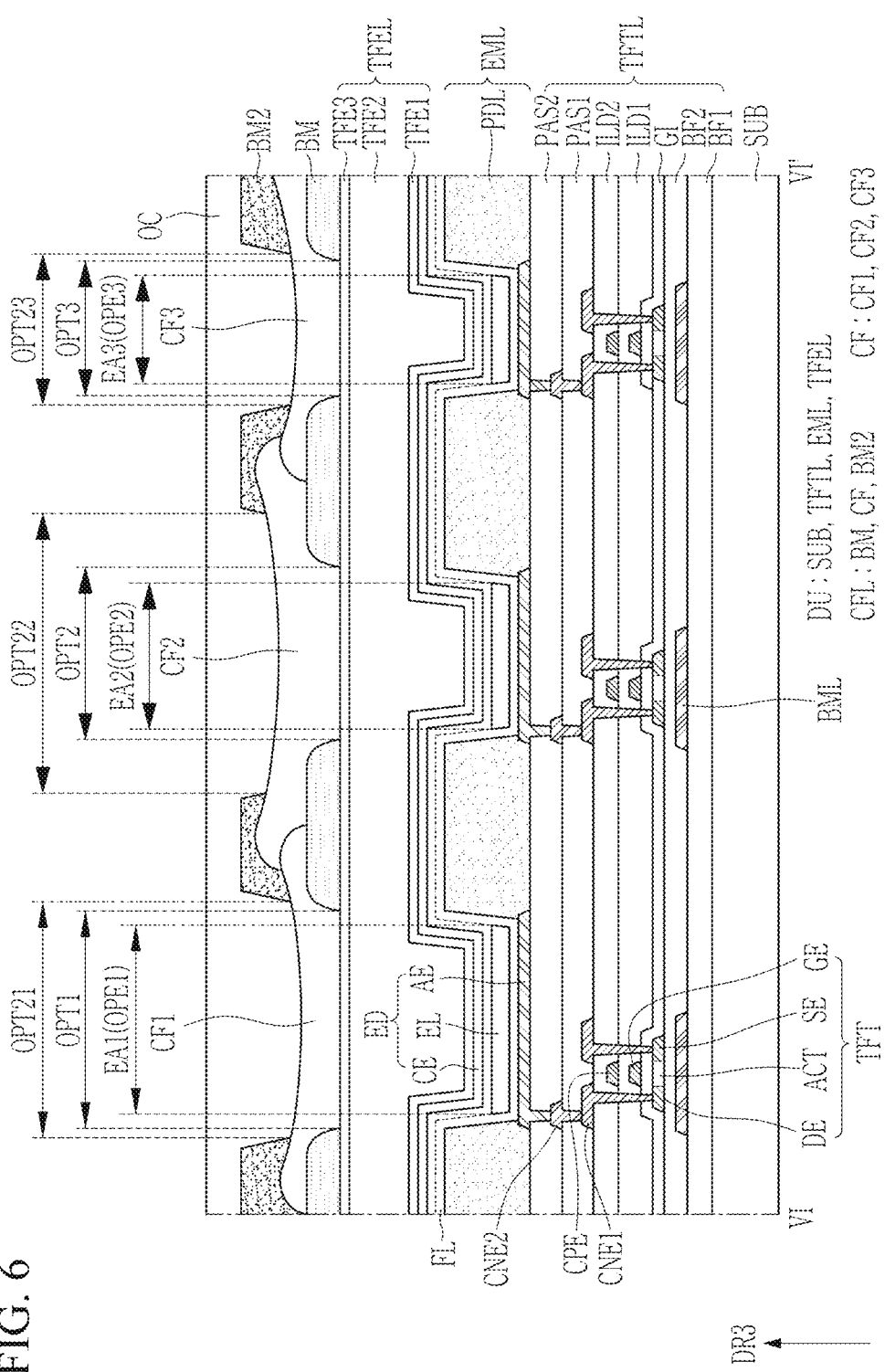
FIG. 6 illustrates a schematic cross-sectional view taken along line VI-VI' of FIG. 5.

According to an embodiment, in the emissive display device 10, the areas of the emission areas EA1, EA2, and EA3 or areas of the openings OPE1, OPE2, and OPE3 of the pixel defining layer PDL may be designed such that reflected light by external light may be recognized as white mixed light. The emissive display device 10 may include color filters CF1, CF2, and CF3 positioned in light emission areas EA1, EA2, and EA3. The color filters CF1, CF2, and CF3 may be positioned to correspond to the emission areas EA1, EA2, and EA3 or the openings OPE1, OPE2, and OPE3. Each of the color filters CF1, CF2, and CF3 may have an area larger than that of the openings OPE1, OPE2, and OPE3 of the pixel defining layer PDL. FIG. 5 illustrates boundaries of adjacent color filters CF1, CF2, and CF3 as straight lines, and in practice, the adjacent color filters CF1, CF2, and CF3 may have overlapping portions overlapping each other with a width (e.g., a predetermined or selectable width). Referring to FIG. 6, the overlapping portions of the color filters CF1, CF2, and CF3 may be formed at a relatively high height to form a step. Upper surfaces of the overlapping portions of the color filters CF1, CF2, and CF3 may be curved so that the incident external light is scattered and reflected, resulting in a strong reflection diffraction pattern, improving visibility of reflection and diffraction. Accordingly, an upper light blocking layer BM2 (see FIG. 7) may be formed on the overlapping portion of the color filters CF1, CF2, and CF3 in the third direction DR3. The upper light blocking layer BM2 may cover the overlapping portion of the color filters CF1, CF2, and CF3 to prevent external light from being scattered and reflected at the overlapping portion of the color filters CF1, CF2, and CF3, thereby lowering visibility of reflection and diffraction.

Referring to FIG. 5, the upper light blocking layer BM2 may have openings OPT21, OPT22, and OPT23.

Referring to FIG. 6 a lower light blocking layer BM may also be positioned below the color filters CF1, CF2, and CF3 in the third direction DR3. Referring to FIG. 5, the lower light blocking layer BM may also have openings OPT1, OPT2, and OPT3.

The openings OPT21, OPT22, and OPT23 of the upper light blocking layer BM2 and the openings OPT1, OPT2, and OPT3 of the lower light blocking layer BM may be formed to overlap the openings OPE1, OPE2, and OPE3 of the pixel defining layer PDL corresponding to the emission areas EA1, EA2, and EA3, and may form a light output area from which light emitted from the emission areas EA1, EA2, and EA3 is outputted. Each of the color filters CF1, CF2, and CF3 may have an area larger than that of the openings OPT21, OPT22, and OPT23 of the upper light blocking layer BM2, the openings OPT1, OPT2, OPT3 of the lower light blocking layer BM, and the openings OPE1, OPE2, and OPE3 of the pixel defining layer PDL, and each of the color filters CF1, CF2, and CF3 may completely cover the light output area.

The openings OPT21, OPT22, and OPT23 of the upper light blocking layer BM2 may be formed to have an area larger than that of the openings OPT1, OPT2, and OPT3 of the lower light blocking layer BM, and boundaries of the openings OPT21, OPT22, and OPT23 of the upper light blocking layer BM2 may be positioned outside the openings OPT1, OPT2, and OPT3 of the lower light blocking layer BM. Accordingly, the upper light blocking layer BM2 may have an area smaller than that of the lower light blocking layer BM.

Each of the color filters CF1, CF2, and CF3 may be positioned to correspond to the emission areas EA1, EA2, and EA3. The color filters CF1, CF2, and CF3 may include a first color filter CF1, a second color filter CF2, and a third color filter CF3 positioned to correspond to different emission areas EA1, EA2, and EA3. The color filters CF1, CF2, and CF3 may include a colorant such as a dye or pigment that absorbs light in a wavelength range other than a specific wavelength range, and may be positioned to correspond to colors of light emitted from the emission areas EA1, EA2, and EA3. For example, the first color filter CF1 may be a red color filter that is positioned to overlap the first emission area EA1 and transmits only red first light. The second color filter CF2 may be a green color filter that is positioned to overlap the second emission area EA2 and transmits only green second light, and the third color filter CF3 may be a blue color filter that is positioned to overlap the subemission areas SEA1 and SEA2 of the third emission area EA3 and transmits only blue third light.

Similar to the disposition of the emission areas EA1, EA2, and EA3, the color filters CF1, CF2, and CF3 may be positioned in the first direction DR1, the second direction DR2, and/or a diagonal direction therebetween. For example, the first color filter CF1 and the second color filter CF2 may be positioned adjacent to each other in the second direction DR2. According to an embodiment, they may be alternately positioned in the second direction DR2 on an entire surface of the display area DA. The first color filter CF1 positioned in the third unit pixel PX3 may be positioned between the second color filter CF2 positioned in the first unit pixel PX1 and the second color filter CF2 positioned in the third unit pixel PX3. The third color filter CF3 may be positioned adjacent to the first color filter CF1 and the second color filter CF2 in the first direction DR1, and the third emission areas EA3 may be repeatedly positioned in the second direction DR2 on the entire surface of the display area DA. For example, the third color filter CF3 positioned in the first unit pixel PX1 may be positioned between the second color filter CF2 positioned in the first unit pixel PX1 and the second color filter CF2 positioned in the second unit pixel PX2.

Referring to FIG. 5, the emissive display device 10 may include a color pattern CP protruding from the first color filter CF1 in the first direction DR1 to contact the third color filter CF3 in the second direction DR2. The color pattern CP may include a same material as the first color filter CF1, and may be integrated with the first color filter CF1. The color pattern CP may include a same material as the first color filter CF1 and may be positioned within each of unit pixels PX1, PX2, PX3, and PX4 in consideration of color sense of light reflected from the emissive display device 10. The color pattern CP may be positioned adjacent to the third color filter CF3 in the second direction DR2, and in this case, positions where the color pattern CP is positioned for each of the unit pixels PX1, PX2, PX3, and PX4 may be different. For example, in the first unit pixel PX1 and the fourth unit pixel PX4, the color pattern CP may be positioned at an upper side of the third color filter CF3, which is a first side of the third color filter CF3 in the second direction DR2, and in the second unit pixel PX2 and the third unit pixel PX3, the color pattern CP may be positioned at a lower side, which is a second side of the third color filter CF3 in the second direction DR2. The color pattern CP may be positioned over two adjacent unit pixels PX1, PX2, PX3, and PX4 in the second direction DR2. Color patterns CP may be spaced apart from each other in the second direction DR2 or in the diagonal direction on an entire surface of the display area DA.

According to an embodiment, the emissive display device 10 may have different areas of the emission areas EA1, EA2, and EA3, and may also have different areas of the color filters CF1, CF2, and CF3. The emission areas EA1, EA2, and EA3 may have areas at specific ratios, and similarly, the color filters CF1, CF2, and CF3 may have areas at specific ratios. However, an area ratio between the emission areas EA1, EA2, and EA3 may be different from an area ratio between the color filters CF1, CF2, and CF3. A relative area ratio of the color filters CF1, CF2, and CF3 may affect color sense of reflected external light in case that the external light is reflected on the emissive display device 10. In the emissive display device 10, the color filters CF1, CF2, and CF3 may have an area of a specific ratio, and the color sense of the external light may have a color that is comfortable for a user's eyes by including the color pattern CP containing a same material as the red color filter. The color pattern CP and the red color filter may have a same material.

However, a disposition of the color filters CF1, CF2, and CF3 is not limited to that illustrated in FIG. 5. Similar to a disposition of emission areas EA1, EA2, and EA3, the color filters CF1, CF2, and CF3 may be positioned in a PEN-TILE™ type, e.g., a DIAMOND PENTILE™ type. A disposition of a protruding portion of the first color filter CF1 may be different from that illustrated in FIG. 5.

According to an embodiment, the color filters CF1, CF2, and CF3 may be positioned to partially overlap adjacent color filters CF1, CF2, and CF3. FIG. 5 illustrates that the color filters CF1, CF2, and CF3 adjacent to each other are positioned to contact each other, and as will be described below, an overlapping portion in which the adjacent color filters CF1, CF2, and CF3 partially overlap each other at a boundary where they contact each other, may be formed. FIG. 5 illustrates a disposition of the color filters CF1, CF2, and CF3 viewed from the top, and it may be understood that the edges of the color filters CF1, CF2, and CF3 positioned at a lower portion are covered by the color filters CF1, CF2, and CF3 positioned at an upper portion among the color filters CF1, CF2, and CF3 overlapping each other. The different color filters CF1, CF2, and CF3, which are in areas that do not overlap the emission areas EA1, EA2, and EA3, may overlap the upper light blocking layer BM2 and the lower light blocking layer BM in a plan view.

In the emissive display device 10, as the color filters CF1, CF2, and CF3 are positioned to overlap each other, intensity of reflected light caused by external light may be reduced. Furthermore, color characteristics (e.g., color sense, color sensitivity, etc.) of light reflected from external light may be controlled by adjusting a disposition, shape, and area of the color filters CF1, CF2, and CF3 in a plan view.

Hereinafter, a cross-sectional structure taken along line VI-VI' of FIG. 5 will be described in detail with respect to FIG. 6.

FIG. 6 illustrates a schematic cross-sectional view taken along line VI-VI' of FIG. 5.

FIG. 6 illustrates a cross-section crossing the first emission area EA1, the second emission area EA2, and the third emission area EA3.

The display panel 100 of the emissive display device 10 may include a display layer DU and an external light reducing layer CFL. The display layer DU may include a substrate SUB, a driving element layer TFTL, a light emitting element layer EML, and an encapsulation layer TFEL. In the display panel 100, the external light reducing layer CFL disposed on the encapsulation layer TFEL may include two light blocking layers BM and BM2, and the color filters CF1, CF2, and CF3 may be positioned on the lower light blocking layer BM and under the upper light blocking layer BM2. The lower light blocking layer BM and the upper light blocking layer BM2 may overlap an overlapping portion of the color filters CF1, CF2, and CF3.

The substrate SUB may be a base substrate or a base layer. The substrate SUB may be a flexible substrate capable of being bent, folded, and/or rolled. For example, the substrate SUB may include a polymer resin such as polyimide (PI), but the disclosure is not limited thereto. For another example, the substrate SUB may include a glass material or a metal material.

The driving element layer TFTL may include a first buffer layer BF1, a lower metal layer BML, a second buffer layer BF2, a transistor TFT, a gate insulating layer GI, a first interlayer insulating layer ILD1, a capacitor electrode CPE, a second interlayer insulating layer ILD2, a first connecting electrode CNE1, a first passivation layer PAS1, a second connecting electrode CNE2, and a second passivation layer PAS2.

The first buffer layer BF1 may be disposed on the substrate SUB. The first buffer layer BF1 may include an inorganic layer capable of preventing penetration of air or moisture. For example, the first buffer layer BF1 may include inorganic layers alternately stacked each other. According to an embodiment, the first buffer layer BF1 may be omitted.

The lower metal layer BML may be disposed on the first buffer layer BF1. For example, the lower metal layer BML may be formed as a single layer or multiple layers made of (or including), e.g., at least one of molybdenum (Mo), aluminum (Al), chromium (Cr), gold (Au), titanium (Ti), nickel (Ni), neodymium (Nd), copper (Cu), and the like or an alloy thereof.

The second buffer layer BF2 may cover the first buffer layer BF1 and the lower metal layer BML. The second buffer layer BF2 may include an inorganic layer capable of preventing penetration of air or moisture. For example, the second buffer layer BF2 may include inorganic layers alternately stacked each other.

The transistor TFT may be positioned on the second buffer layer BF2, and the transistor TFT may be a driving transistor or a switching transistor of the pixel circuit part. The transistor TFT may include a semiconductor layer ACT, a source electrode SE, a drain electrode DE, and a gate electrode GE.

The semiconductor layer ACT may be disposed on the second buffer layer BF2. The semiconductor layer ACT may overlap the lower metal layer BML, and the gate electrode GE in a thickness direction, and may be insulated from the gate electrode GE by the gate insulating layer GI. In a portion of the semiconductor layer ACT, a material of the semiconductor layer ACT may be conductive to form the source electrode SE and the drain electrode DE. The semiconductor layer ACT may be positioned between the source electrode SE and the drain electrode DE, and may include an undoped channel layer.

The gate electrode GE may be positioned on the gate insulating layer GI. The gate electrode GE may overlap the semiconductor layer ACT with the gate insulating layer GI provided therebetween.

The gate insulating layer GI may be disposed on the semiconductor layer ACT. For example, the gate insulating layer GI may cover the semiconductor layer ACT and the second buffer layer BF2, and may insulate the semiconductor layer ACT from the gate electrode GE. The gate insulating layer GI may include a contact hole through which (or in which) the first connection electrode CNE1 extends.

The first interlayer insulating layer ILD1 may cover the gate electrode GE and the gate insulating layer GI. The first interlayer insulating layer ILD1 may include a contact hole through which the first connection electrode CNE1 extends. The contact hole of the first interlayer insulating layer ILD1 may be electrically connected to the contact hole of the gate insulating layer GI and the contact hole of the second interlayer insulating layer ILD2.

The capacitor electrode CPE may be disposed on the first interlayer insulating layer ILD1. The capacitor electrode CPE may overlap the gate electrode GE in a thickness direction. The capacitor electrode CPE and the gate electrode GE may generate capacitance.

The second interlayer insulating layer ILD2 may cover the capacitor electrode CPE and the first interlayer insulating layer ILD1. The second interlayer insulating layer ILD2 may include a contact hole through which the first connection electrode CNE1 extends. The contact hole of the second interlayer insulating layer ILD2 may be connected to the contact hole of the first interlayer insulating layer ILD1 and the contact hole of the gate insulating layer GI.

The first connection electrode CNE1 may be positioned on the second interlayer insulating layer ILD2. The first connection electrode CNE1 may electrically connect the drain electrode DE of the transistor TFT and the second connecting electrode CNE2. The first connecting electrode CNE1 may be inserted into contact holes formed in the second interlayer insulating layer ILD2, the first interlayer insulating layer ILD1, and the gate insulating layer GI to contact the drain electrode DE of the transistor TFT.

The first passivation layer PAS1 may cover the first connecting electrode CNE1 and the second interlayer insulating layer ILD2. The first passivation layer PAS1 may protect the transistor TFT. The first passivation layer PAS1 may include a contact hole through which the second connecting electrode CNE2 extends.

The second connecting electrode CNE2 may be positioned on the first passivation layer PAS1. The second connecting electrode CNE2 may electrically connect the first connecting electrode CNE1 and a pixel electrode AE (hereinafter also referred to as an anode or a first electrode) of the light emitting diode ED. The second connecting electrode CNE2 may be inserted into a contact hole formed in the first passivation layer PAS1 to contact the first connecting electrode CNE1.

The second passivation layer PAS2 may cover the second connecting electrode CNE2 and the first passivation layer PAS1. The second passivation layer PAS2 may include a contact hole through which the pixel electrode AE of the light emitting diode ED extends.

The light emitting element layer EML may be positioned on the driving element layer TFTL. The light emitting element layer EML may include a light emitting diode ED and a pixel defining layer PDL. The light emitting diode ED may include a pixel electrode AE, an emission layer EL, and a common electrode CE (hereinafter referred to as a second electrode or cathode). The light emitting diode ED may additionally include at least one of a hole injection layer, a hole transport layer, an electron injection layer, or an electron transport layer, and may further include functional layers FL disposed at opposite sides of the emission layer EL.

The pixel electrode AE may be positioned on the second passivation layer PAS2. The pixel electrode AE may be positioned to overlap at least one of the openings OPE1, OPE2, and OPE3 of the pixel defining layer PDL. The pixel electrode AE may be electrically connected to the drain electrode DE of the transistor TFT through the first and second connecting electrodes CNE1 and CNE2.

The emission layer EL may be disposed on the pixel electrode AE. For example, the emission layer EL may be an organic light emitting layer made of an organic material, but the disclosure is not limited thereto. A functional layer FL may be disposed at opposite sides of the emission layer EL, the functional layer FL disposed between the emission layer EL and the pixel electrode AE may include a hole injection layer and/or a hole transport layer, and the functional layer FL disposed between the emission layer EL and the common electrode CE may include an electron transport layer and/or an electron injection layer. In case that the emission layer EL corresponds to an organic light emitting layer, the transistor TFT applies a voltage (e.g., a predetermined or selectable voltage) to the pixel electrode AE of the light emitting diode ED, and the common electrode CE of the light emitting diode ED receives a common voltage or a driving low voltage, holes and electrons may respectively move to the emission layer EL through the hole transport layer and the electron transport layer to flow a current through the light emitting diode ED, and holes and electrons may be combined with each other in the emission layer EL to emit light.

The common electrode CE may be positioned on the emission layer EL. For example, the common electrode CE may be implemented in the form of an electrode common to all pixels, not differentiated by pixels. The common electrode CE may be positioned on the emission layer EL in the first to third emission areas EA1, EA2, and EA3, and may be positioned on the pixel defining layer PDL in areas other than the first to third emission areas EA1, EA2, and EA3. The functional layer FL may be disposed between the pixel defining layer PDL and the common electrode CE.

The common electrode CE may receive a common voltage or a driving low voltage. In case that the pixel electrode AE receives a voltage corresponding to the data voltage and the common electrode CE receives the driving low voltage, a potential difference may be formed between the pixel electrode AE and the common electrode CE, and the emission layer EL may emit light as a current flows therethrough.

The pixel defining layer PDL may include openings OPE1, OPE2, and OPE3 and may be disposed on portions of the second passivation layer PAS2 and the pixel electrode AE. The pixel defining layer PDL may include a first opening OPE1, a second opening OPE2, and a third opening OPE3, and each of the openings OPE1, OPE2, and OPE3 may expose a portion of the pixel electrode AE. As described above, the openings OPE1, OPE2, and OPE3 of the pixel defining layer PDL may define the first to third emission areas EA1, EA2, and EA3, respectively, and their areas or sizes may be different from each other. The pixel defining layer PDL may separate and insulate the pixel electrode AE of each of light emitting diodes ED. The pixel defining layer PDL may be a black pixel defining layer including a light absorbing material to prevent reflection of external light. For example, the pixel defining layer PDL may include a polyimide (PI)-based binder and pigments in which red, green, and blue colors are mixed. As another example, the pixel defining layer PDL may include a cardo-based binder resin and a mixture of a lactam black pigment and a blue pigment. As another example, the pixel defining layer PDL may include carbon black.

The encapsulation layer TFEL may be disposed on the common electrode CE to cover the light emitting diodes ED. The encapsulation layer TFEL may include at least one inorganic layer to prevent oxygen or moisture from penetrating into the light emitting element layer EML. The encapsulation layer TFEL may include at least one organic film to protect the light emitting element layer EML from foreign particles such as dust.

The encapsulation layer TFEL in FIG. 6 may include a first encapsulation layer TFE1, a second encapsulation layer TFE2, and a third encapsulation layer TFE3. The first encapsulation layer TFE1 and the third encapsulation layer TFE3 may be inorganic encapsulation layers, and the second encapsulation layer TFE2 disposed therebetween may be an organic encapsulation layer.

The first encapsulation layer TFE1 and the third encapsulation layer TFE3 may each include at least one inorganic insulator. The inorganic insulator may include, e.g., an aluminum oxide, a titanium oxide, a tantalum oxide, a hafnium oxide, a zinc oxide, a silicon oxide, a silicon nitride, a silicon oxynitride, and/or a combination thereof.

The second encapsulation layer TFE2 may include a polymer-based material. The polymer-based material may include, e.g., an acrylic resin, an epoxy resin, polyimide, polyethylene, or a combination thereof. For example, the second encapsulation layer TFE2 may include an acrylic resin, e.g., polymethyl methacrylate or polyacrylic acid. The second encapsulation layer TFE2 may be formed by curing a monomer or applying a polymer.

The external light reducing layer CFL disposed on the encapsulation layer TFEL may include two light blocking layers BM and BM2 and color filters CF1, CF2, and CF3. The color filters CF1, CF2, and CF3 may be positioned on the lower light blocking layer BM and under the upper light blocking layer BM2. The lower light blocking layer BM and the upper light blocking layer BM2 may overlap an overlapping portion of the color filters CF1, CF2, and CF3.

The lower light blocking layer BM may be positioned on the encapsulation layer TFEL. The lower light blocking layer BM may include openings OPT1, OPT2, and OPT3 positioned to overlap the emission areas EA1, EA2, and EA3. The first opening OPT1 may be positioned to overlap the first emission area EA1 or the first opening OPE1. The second opening OPT2 may be positioned to overlap the second emission area EA2 or the second opening OPE2, and the third opening OPT3 may be positioned to overlap the third emission area EA3 or the third opening OPE3. An area or size of each of the openings OPT1, OPT2, and OPT3 may be larger than that of the openings OPE1, OPE2, and OPE3 of the pixel defining layer PDL. As the openings OPT1, OPT2, and OPT3 of the lower light blocking layer BM are formed to be larger than the openings OPE1, OPE2, and OPE3 of the pixel defining layer PDL, light emitted from the emission areas EA1, EA2, and EA3 may be viewed by a user not only from a front surface but also from a side surface of the emissive display device 10.

The lower light blocking layer BM may include a light absorbing material. For example, the lower light blocking layer BM may include an inorganic black pigment or an organic black pigment. The inorganic black pigment may be carbon black, and the organic black pigment may include at least one of lactam black, perylene black, and aniline black, but the disclosure is not limited thereto. The lower light blocking layer BM may improve color reproducibility of the emissive display device 10 by preventing visible light from penetrating between the first to third light emitting regions EA1, EA2, and EA3 and mixing colors.

The color filters CF1, CF2, and CF3 of the external light reducing layer CFL may be positioned on the lower light blocking layer BM. The different color filters CF1, CF2, and CF3 may be respectively positioned to correspond to the different emission areas EA1, EA2, and EA3, the openings OPE1, OPE2, and OPE3 of the pixel defining layer PDL, and the openings OPT1, OPT2, and OPT3 of the lower light blocking layer BM. For example, the first color filter CF1 may be positioned to correspond to the first emission area EA1, the second color filter CF2 may be positioned to correspond to the second emission area EA2, and the third color filter CF3 may be positioned to correspond to the third emission area EA3. The first color filter CF1 may be positioned in the first opening OPT1 of the lower light blocking layer BM, the second color filter CF2 may be positioned in the second opening OPT2 of the lower light blocking layer BM, and the third color filter CF3 may be positioned in the third opening OPT3 of the lower light blocking layer BM. Each of the color filters CF1, CF2, and CF3 may be positioned to have a larger area in a plan view than the openings OPT1, OPT2, and OPT3 of the lower light blocking layer BM, and some of the color filters CF1, CF2, and CF3 may be directly positioned on the lower light blocking layer BM. An overlapping portion where adjacent color filters CF1, CF2, and CF3 overlap each other may be positioned on the lower light blocking layer BM.

The upper light blocking layer BM2 may be positioned on the overlapping portion where the color filters CF1, CF2, and CF3 overlap each other. The upper light blocking layer BM2 may include openings OPT21, OPT22, and OPT23 positioned to overlap the emission areas EA1, EA2, and EA3 and the openings OPT1, OPT2, and OPT3 of the lower light blocking layer BM. The first opening OPT21 may be positioned to overlap the first emission area EA1 or the first opening OPE1 and the opening OPT1. The second opening OPT22 may be positioned to overlap the second emission area EA2 or the second opening OPE2 and the opening OPT2, and the third opening OPT23 may be positioned to overlap the third emission area EA3 or the third opening OPE3 and the opening OPT3. An area or size of each of the openings OPT21, OPT22, and OPT23 may be larger than that of the openings OPE1, OPE2, and OPE3 of the pixel defining layer PDL and the openings OPT1, OPT2, and OPT3 of the lower light blocking layer BM. As the openings OPT21, OPT22, and OPT23 are formed larger than the openings OPE1, OPE2, and OPE3 of the pixel defining layer PDL and the openings OPT1, OPT2, and OPT3 of the lower light blocking layer BM may be viewed by a user not only from a front surface but also from a side surface of the emissive display device 10.

The upper light blocking layer BM2 may include a light absorbing material. The upper light blocking layer BM2 may include an inorganic black pigment or an organic black pigment. The inorganic black pigment may be carbon black, and the organic black pigment may include, e.g., at least one of lactam black, perylene black, and aniline black, but the disclosure is not limited thereto. The upper light blocking layer BM2 may improve color reproducibility of the emissive display device 10 by preventing visible light from penetrating between the first to third light emitting regions EA1, EA2, and EA3 and mixing colors.

The upper light blocking layer BM2 may be positioned above the overlapping portion of the color filters CF1, CF2, and CF3 to reduce scattering and reflection of external light generated at the overlapping portion of the color filters CF1, CF2, and CF3. As a result, a reflection diffraction pattern may be reduced, and visibility of reflection and diffraction may be reduced.

The external light reducing layer CFL may further include a planarization layer OC, and the planarization layer OC may be disposed on the color filters CF1, CF2, and CF3 and the upper light blocking layer BM2 to planarize upper ends of the color filters CF1, CF2, and CF3 and the upper light blocking layer BM2. The planarization layer OC may be a colorless light-transmitting layer that does not have a color in a visible light range. For example, the planarization layer OC may include a colorless light-transmitting organic material such as an acryl-based resin.

Although the lower light blocking layer BM may include a material that absorbs light, some of light incident from the outside may be reflected by the lower light blocking layer BM. However, in FIG. 6, an upper light blocking layer BM2 may also be formed at an upper portion to remove external light reflected from the lower light blocking layer BM.

In the embodiment, the upper light blocking layer BM2 may be formed to overlap the overlapping portion of the color filters CF1, CF2, and CF3 in order to reduce the scattering and reflection of external light generated at an upper portion of the overlapping portion where the color filters CF1, CF2, and CF3 overlap each other. Hereinafter, characteristics such as intervals between the pixel defining layer PDL, the lower light blocking layer BM, and the upper light blocking layer BM2 will be described in more detail with respect to FIG. 7.

Figure 7:
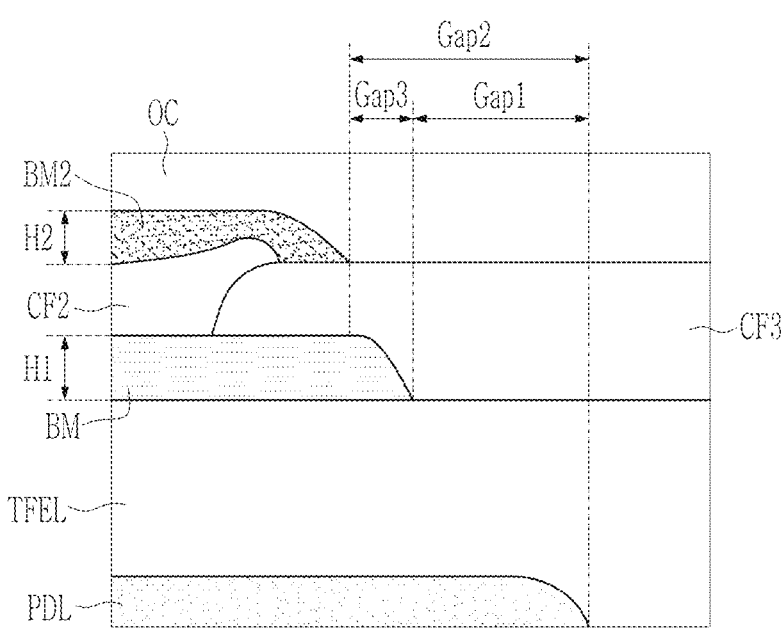
FIG. 7 illustrates a schematic enlarged cross-sectional view illustrating a positional relationship between a pixel defining layer, a color filter, and a light blocking layer in an emissive display device according to an embodiment.
Figure 7:
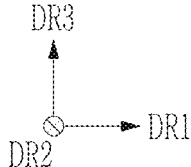

FIG. 7 illustrates a schematic enlarged cross-sectional view illustrating a positional relationship of a pixel defining layer, a color filter, and a light blocking layer in an emissive display device according to an embodiment.

Referring to FIG. 7, herein, the lower light blocking layer BM and the upper light blocking layer BM2 may overlap the overlapping portion of the color filters CF1, CF2, and CF3, and the pixel defining layer PDL positioned at a lower portion may also overlap the overlapping portion of the color filters CF1, CF2, and CF3.

FIG. 7 illustrates thicknesses H1 and H2 of the lower light blocking layer BM and the upper light blocking layer BM2, and also illustrates a horizontal gap (or horizontal distance) Gap1 between the pixel defining layer PDL and the lower light blocking layer BM, a horizontal gap Gap2 between the pixel defining layer PDL and the upper light blocking layer BM2, and a horizontal gap Gap3 between the lower light blocking layer BM and the upper light blocking layer BM2.

First, the thicknesses H1 and H2 of the lower light blocking layer BM and the upper light blocking layer BM2 may be a thickness of about 1 μm or more, and may be a thickness of about 1.5 μm according to another embodiment. The thickness H2 of the upper light blocking layer BM2 may be greater than the thickness H1 of the lower light blocking layer BM in order to reduce scattering and reflection of external light. According to another embodiment, the thicknesses H1 and H2 of the lower light blocking layer BM and the upper light blocking layer BM2 may be a thickness of about 1 μm or more and about 3 μm or less (or in a range of about 1 μm to about 3 μm). According to another embodiment, the lower light blocking layer BM and the upper light blocking layer BM2 may have different thicknesses, and the upper light blocking layer BM2 may be thicker than the lower light blocking layer BM. The upper light blocking layer BM2 may have a thickness of about 1 μm or more and about 3 μm or less, and the lower light blocking layer BM may have a thickness of about 1 μm or more and about 1.5 μm or less.

The horizontal gap Gap1 between the pixel defining layer PDL and the lower light blocking layer BM may be about 3 μm or more and about 6.8 μm or less. The horizontal gap Gap2 between the pixel defining layer PDL and the upper light blocking layer BM2 may have a value of about 6 μm or more and about 8.5 μm or less. The horizontal gap Gap3 between the lower light blocking layer BM and the upper light blocking layer BM2 may have a value of about 1.7 μm or more and about 3 μm or less. The horizontal gap Gap2 between the pixel defining layer PDL and the upper light blocking layer BM2 and the horizontal gap Gap3 between the lower light blocking layer BM and the upper light blocking layer BM2 may have different intervals depending on colors, may have a largest interval value in blue, may have a next largest interval value in red, and may have a smallest interval value in green. However, a difference of about 0.05 μm or less may occur even at intervals that are different for each color, so that there may not be a substantial difference.

Hereinafter, a value obtained by measuring the horizontal gap Gap3 between the lower light blocking layer BM and the upper light blocking layer BM2 in the emissive display device according to an embodiment will be described with reference to FIG. 8.

Figure 8:
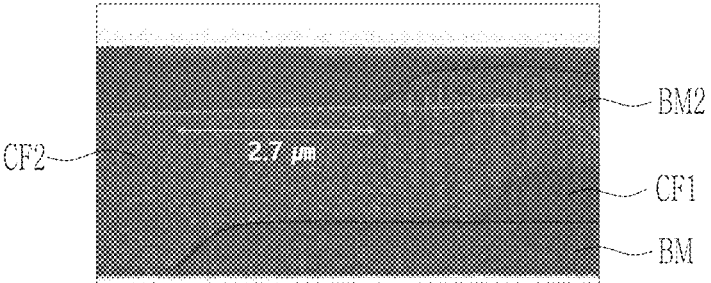
FIG. 8 illustrates a photograph of a color filter and a light blocking layer of an emissive display device according to an embodiment.

FIG. 8 illustrates a photograph of a color filter and a light blocking layer of an emissive display device according to an embodiment.

Referring to FIG. 8, it may be seen that a horizontal interval between the lower light blocking layer BM and the upper light blocking layer BM2 is about 2.7 μm in an embodiment. It may be seen that the horizontal gap Gap3 between the lower light blocking layer BM and the upper light blocking layer BM2 has a value corresponding to a value of about 1.7 μm or more and about 3 μm or less. The horizontal gap Gap3 between the lower light blocking layer BM and the upper light blocking layer BM2 may need to be at least about 1.7 μm, which is a minimum interval to secure about 45% front-facing luminance at a side angle of about 45 degrees, and this will be described with FIG. 9.

Hereinafter, the horizontal gap Gap3 between the lower light blocking layer BM and the upper light blocking layer BM2 will be described with respect to FIG. 9.

Figure 9:
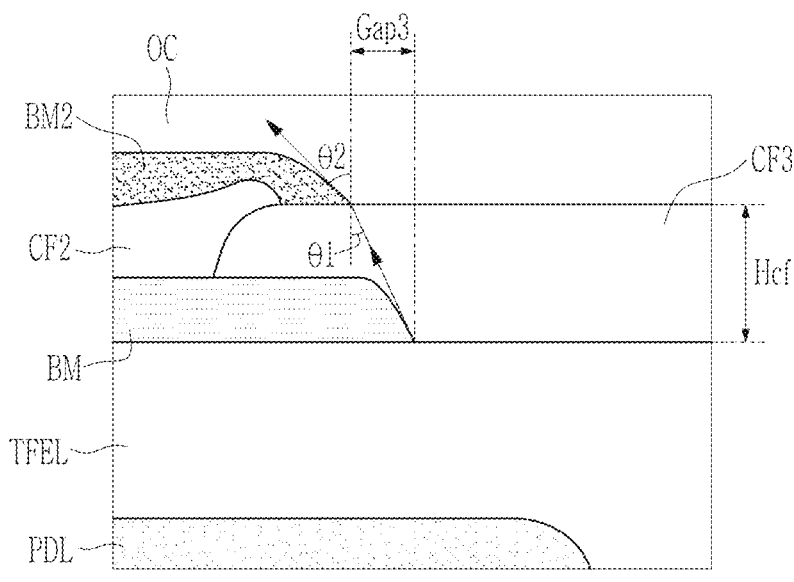
FIG. 9 illustrates a schematic cross-sectional view illustrating a positional relationship between a side viewing angle, a light blocking layer, and a pixel defining film in an embodiment.
Figure 9:
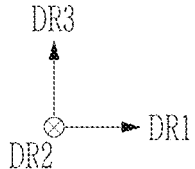

FIG. 9 illustrates a schematic cross-sectional view illustrating a positional relationship between a side viewing angle, a light blocking layer, and a pixel defining layer in an embodiment.

According to an embodiment, in order for the emissive display device to secure about 45% front-facing luminance at a side angle of about 45 degrees, as illustrated in FIG. 9, light traveling from an end of the lower light blocking layer BM to an end of the upper light blocking layer BM2 should be able to travel at a bending angle of about 45 degrees as incident from the color filter to the planarization layer OC.

An angle θ1 of the incident light illustrated in FIG. 9 may be determined by a thickness Hcf of the color filter CF3 and the horizontal gap Gap3 between the lower light blocking layer BM and the upper light blocking layer BM2. In case that an angle θ2 of the emitted light is about 45 degrees, a refractive index of the color filter is n1, and a refractive index of the planarization layer OC is n2, Equation 1 below may be satisfied according to Snell's law.

$$\mathrm{Sin}(\theta 1) \times (n1) = \mathrm{Sin}(\theta 2)\theta(n2) \qquad \text{[Equation 1]}$$

The refractive index n2 of the planarization layer OC and the refractive index n1 of the color filter may differ depending on a material used, and thus it may be calculated using the refractive index of the material actually used. The refractive index n1 of the color filter may vary depending on the color, and the refractive index n2 of the planarization layer OC may have a value of about 1.5 or more and about 1.6 or less.

According to an embodiment, the horizontal gap Gap3 between the lower light blocking layer BM and the upper light blocking layer BM2, calculated by inputting the refractive index n2 of the planarization layer OC used in the emissive display device and the refractive index n1 of a color filter of each color into Equation 1 above, measuring the thickness of each color filter, and inserting the measured thickness of each color filter into Equation 1, is shown in Table 1 below.

TABLE 1

| | Thickness (μm) of color filter | Gap3 (μm) |
| --- | --- | --- |
| Red color filter | 3.60 | 1.69 |
| Green color filter | 3.25 | 1.65 |
| Blue color filter | 3.40 | 1.70 |

It may be seen from Table 1 that the horizontal gap Gap3 between the lower light blocking layer BM and the upper light blocking layer BM2 has a minimum value of about 1.65 μm in green color and a maximum value of about 1.70 μm value in blue color. Since light of all colors must be visible at the side angle of about 45 degrees, it may be seen that the horizontal gap Gap3 between the lower light blocking layer BM and the upper light blocking layer BM2 must have a minimum value of about 1.7 μm.

The maximum value of the horizontal gap Gap3 between the lower light blocking layer BM and the upper light blocking layer BM2 may be variously changed depending on a type of electronic device in which the emissive display device is used, an area and resolution of the display area, and the like. In the case of a high-resolution emissive display device, the horizontal gap Gap3 between the lower light blocking layer BM and the upper light blocking layer BM2 may have a value of about 3 μm or less.

Referring to Table 1, the color filters of red, green, and blue may have different thicknesses, and may have a thickness of about 3 μm or more and about 4 μm or less. The thickness of such a color filter may be to prevent transmittance of light passing through the color filter from falling below about 60%. For example, in the emissive display device according to the disclosure, a basic role of the color filter may be to reduce reflection of external light, and thus in case that the color filter is formed thick, transmittance of light emitted from an emission layer may decrease, and the luminance of the emissive display device may decrease. Accordingly, the thickness of the color filter may be set to about 3 μm or more and about 4 μm or less to have light transmittance exceeding about 60%.

Hereinafter, reflection and diffraction characteristics of the light emitting display having the horizontal gap Gap3 between the lower light blocking layer BM and the upper light blocking layer BM2 will be described with respect to FIGS. 10A and 10B.

Figure 10A:
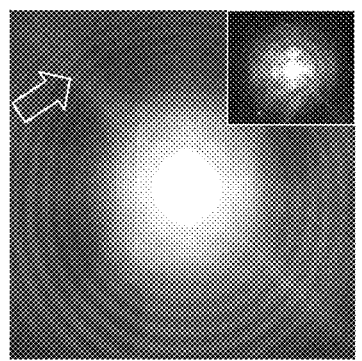
FIGS. 10A and 10B each illustrate a photograph of reflection characteristics of emissive display devices according to a comparative example and an example.
Figure 10B:
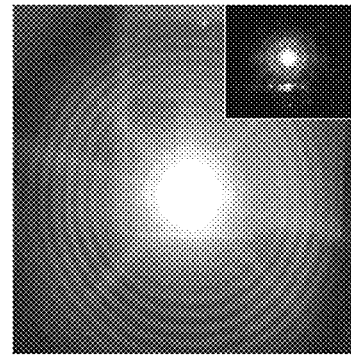

FIGS. 10A and 10B each illustrate a photograph of reflection characteristics of emissive display devices according to a comparative example and an example.

FIG. 10A illustrates a photograph of the reflection characteristic of external light in the comparative example, and FIG. 10B illustrates a photograph of the reflection characteristic of external light in the embodiment of FIG. 8. The comparative example of FIG. 10A does not include only the upper light blocking layer BM2 compared to the example, and other structures are the same as those of the example.

Comparing a small photo of FIG. 10A with a small photo of FIG. 10B, in the example, it may be seen that the reflection and diffraction of external light is less than that of the comparative example. In FIG. 10A, it may be seen that a strong reflection diffraction pattern is visible, as indicated by an arrow, and thus, there is a disadvantage at least in that the reflection and diffraction of external light is well recognized by a user.

It may be seen that, in the comparative example of FIG. 10A, a scattering and reflection value was measured as 6.01, and in the example of FIG. 10B, a scattering and reflection value was measured as about 5.88, so that the scattering and reflection value is reduced by about 0.13 and improved by about 2%. This is because the upper light blocking layer BM2 is also positioned on top of the color filters CF1, CF2, and CF3, and has a structure to cover an overlapping portion of the color filters CF1, CF2, and CF3, and thus reflection and scattering and reflection of external light in a specific direction occurring at the overlapping portion of the color filters CF1, CF2, and CF3 may be reduced and scattering and reflection of external light is reduced as a whole.

Hereinafter, a modification of the embodiment of FIG. 5 will be described with reference to FIGS. 11 and 12.

Figure 11:
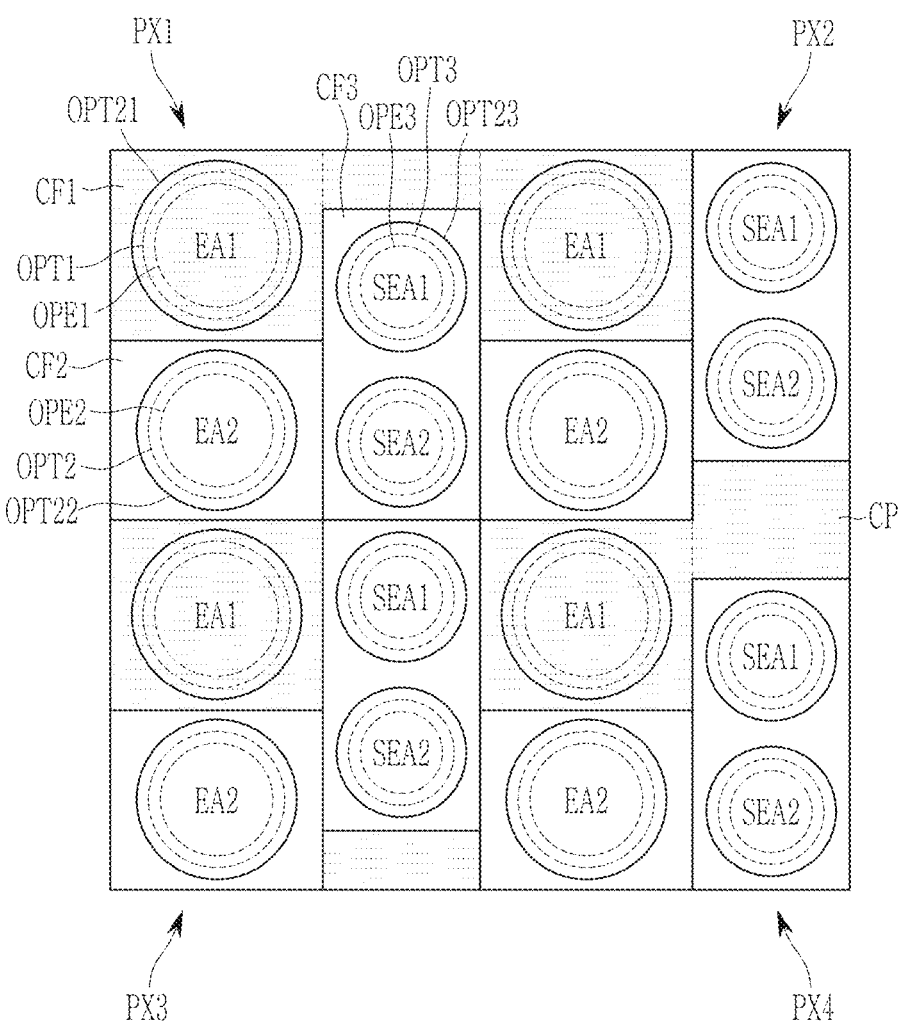
FIG. 11 and FIG. 12 each illustrate a plan view illustrating a disposition of an emission area, a color filter, and a light blocking layer in a display area of an emissive display device according to another embodiment.
Figure 11:
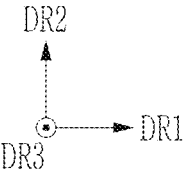
Figure 12:
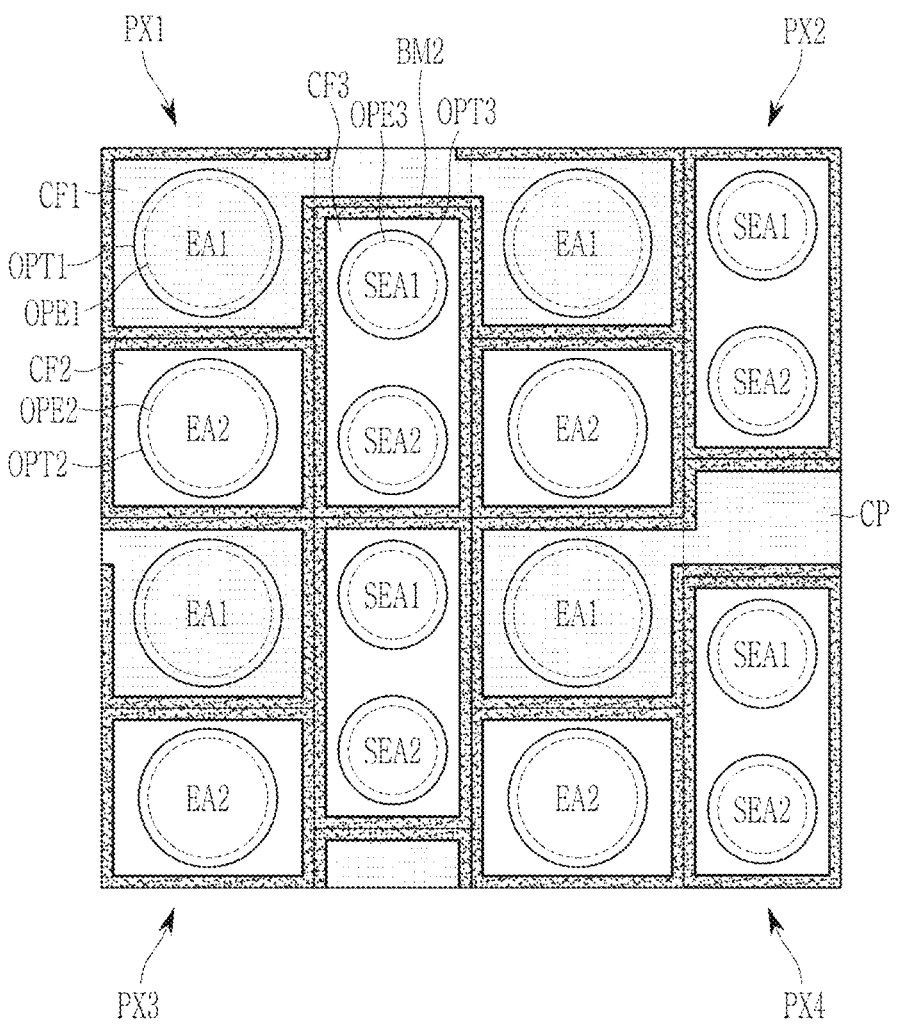
Figure 12:
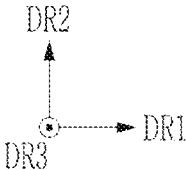

FIGS. 11 and 12 each illustrate a schematic plan view illustrating a disposition of an emission area, a color filter, and a light blocking layer in a display area of an emissive display device according to another embodiment.

First, unlike FIG. 5, FIG. 11 illustrates an embodiment in which a first side parallel to the first direction DR1 in the third emission area EA3 coincides with a first side parallel to the first direction DR1 in the first emission area EA1 and the second emission area EA2. In the embodiment of FIG. 5, a side parallel to the first direction DR1 in the third emission area EA3 does not coincide with the first side parallel to the first direction DR1 in the first emission area EA1 and the second emission area EA2. For example, the embodiment shown in FIG. 11 may include a same material as the first color filter CF1 and may be different from the embodiment shown in FIG. 5 in a disposition of the color pattern CP, which is a portion integrated with (or integral with) the first color filter CF1. As a result, in the embodiment of FIG. 11, the color pattern CP may be positioned only at a side of a third emission area EA3, and two third emission areas EA3 adjacent to each other in the second direction DR2 may contact each other. In contrast, in the embodiment of FIG. 5, the color pattern CP may be positioned only at opposite sides of a third emission area EA3, two third emission areas EA3 adjacent to each other in the second direction DR2 may not contact each other, and the color pattern CP may be positioned therebetween. Unlike in the embodiments of FIGS. 5 and 11, the color pattern CP may be formed at a different position or made of a same material as the color filter of a different color.

In the embodiment of FIG. 12, in which the upper light blocking layer BM2 is formed to have a minimum area, the upper light blocking layer BM2 may be positioned on an overlapping portion where two of the color filters CF1, CF2, and CF3 overlap each other, and may have a linear structure with a constant width along the overlapping portions of the color filters CF1, CF2, and CF3. A width of the upper light blocking layer BM2 may be formed to cover all overlapping portions having steps generated while overlapping the color filters CF1, CF2, and CF3. The width of the overlapping portion of the color filters CF1, CF2, and CF3 may be changed according to the thickness of each of the color filters CF1, CF2, and CF3, and in case that the thickness of the color filters CF1, CF2, and CF3 is large, the width of the overlapping portion may be reduced. In the embodiment of FIG. 12, the upper light blocking layer BM2 may have a thickness of about 1 μm or more and about 3 μm or less, and may have a width of about 1 μm or more and about 10 μm or less to an extent that the color filters CF1, CF2, and CF3 can cover the overlapping portions having steps.

Hereinafter, a reflection characteristic of external light in the embodiment of FIG. 5 (hereinafter also referred to as Example 1), the embodiment of FIG. 12 (hereinafter also referred to as Example 2), and various comparative examples will be compared and described with respect to FIG. 13.

Figure 13:
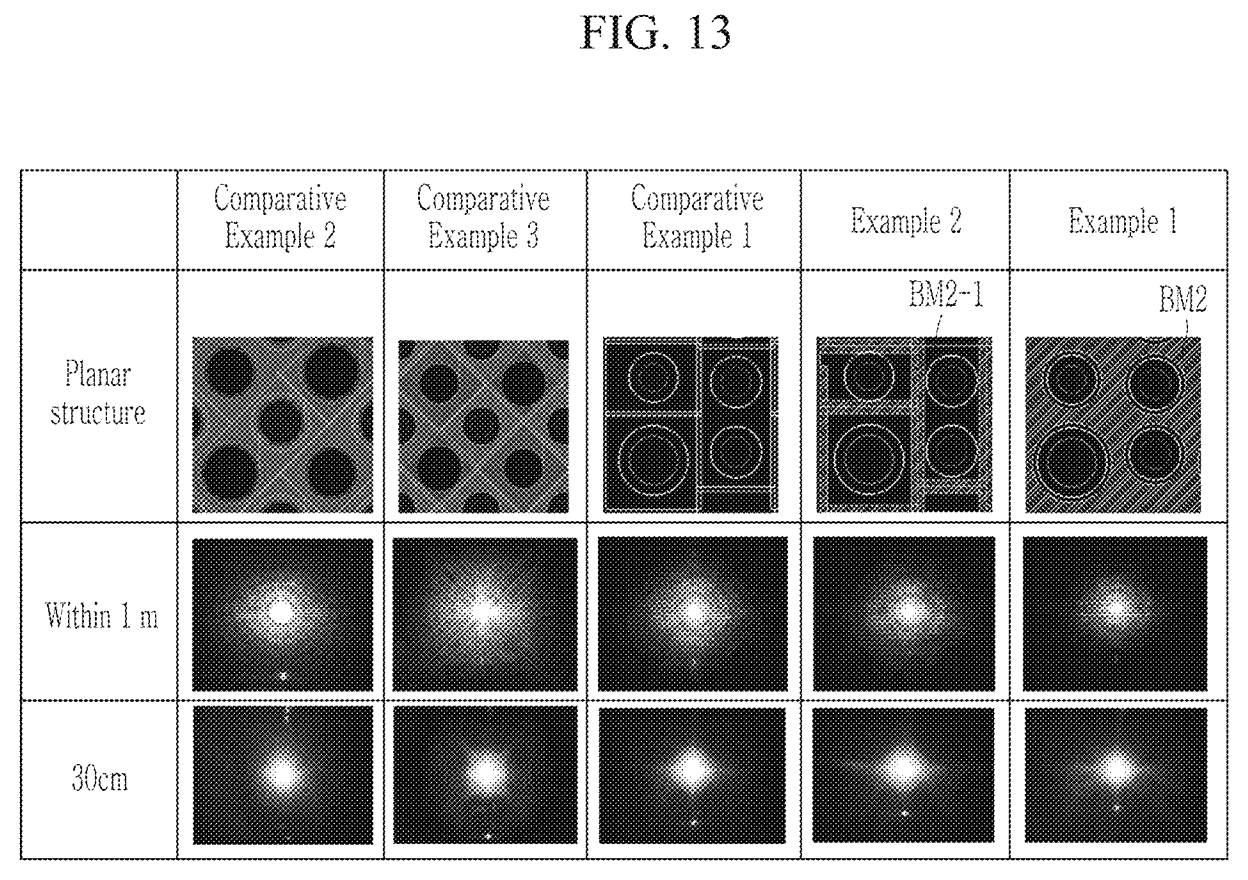

FIG. 13 illustrates a table comparing reflection characteristics of emissive display devices according to a comparative example and an example.

Comparative Example 1 of FIG. 13 is the same as the embodiments of FIGS. 5 and 12, but does not include an upper light blocking layer and includes only a lower light blocking layer. Comparative Example 2 and Comparative Example 3 of FIG. 13 are examples in which boundaries of the color filters are positioned in an oblique direction. Referring to FIGS. 5 and 12, in Examples 1 and 2, the boundaries of the color filters are positioned in the first direction DR1 and the second direction DR2, and are not positioned in an oblique direction, which may be the same in Comparative Example 1.

In FIG. 13, there are largely two types of pictures taken, a first one is a picture taken with external light provided within about 1 m, and a second one is a picture taken with external light provided at about 30 cm. The photo taken at about 1 m shows the characteristics of external light being reflected and diffracted, and the photo taken at about 30 cm shows a size and intensity of halo generated around strong light.

Referring to FIG. 13, it may be seen that the diffraction characteristics in Comparative Examples 1 to 3 are greater than those in Examples 1 and 2, and comparing Comparative Example 1 with Examples 1 and 2, relatively large halo is seen in Comparative Example 1, and in particular, light viewed in a specific direction is well recognized. Comparative Examples 2 and 3 show light in a different direction from Examples 1 and 2, and in these cases, the upper light blocking layer is not formed, so light in a specific direction is well seen, and scattering and reflection of external light is well recognized. However, in case that the upper light blocking layer is included as in Examples 1 and 2, scattering and reflection of external light may be relatively less visible by reducing scattering and reflection generated in the overlapping portion of the color filters.

Hereinafter, an embodiment in which only the upper light blocking layer BM2 is formed will be described with respect to FIG. 14.

Figure 14:
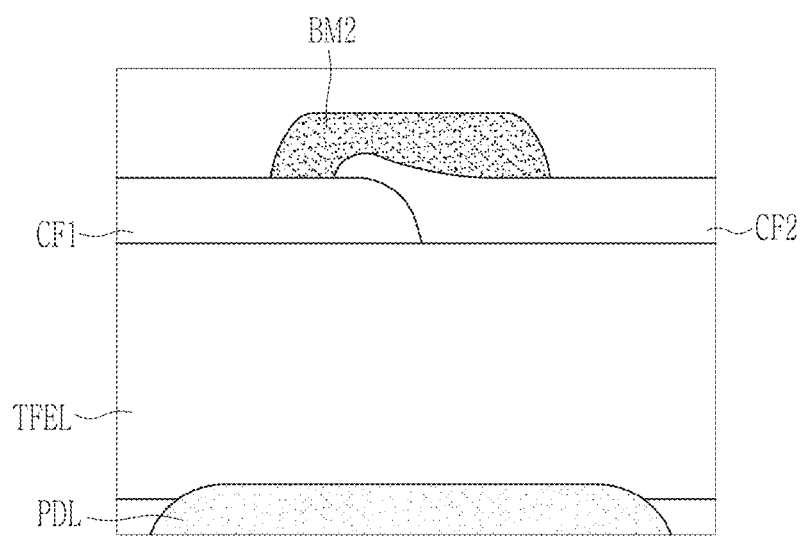
FIG. 14 illustrates a schematic enlarged cross-sectional view illustrating a positional relationship of a pixel defining layer, a color filter, and a light blocking layer in an emissive display device according to another embodiment.
Figure 14:
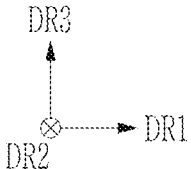

FIG. 14 illustrates a schematic enlarged cross-sectional view illustrating a positional relationship of a pixel defining layer, a color filter, and a light blocking layer in an emissive display device according to another embodiment.

Referring to FIG. 14, the upper light blocking layer BM2 is positioned above the color filters CF1, CF2, and CF3 of the external light reducing layer CFL, but no separate light blocking layer is formed below the color filters CF1, CF2, and CF3. For example, in FIG. 14, only the upper light blocking layer BM2 is positioned above the overlapping portion of the color filters CF1, CF2, and CF3. The upper light blocking layer BM2 may include an opening as shown in FIG. 5 or may be formed linearly along the overlapping portion of the color filters CF1, CF2, and CF3 as illustrated in FIG. 12. For this effect, the upper light blocking layer BM2 may include a light absorbing material. The upper light blocking layer BM2 may include an inorganic black pigment or an organic black pigment. The inorganic black pigment may be carbon black, and the organic black pigment may include at least one of lactam black, perylene black, or aniline black, but the disclosure is not limited thereto. The upper light blocking layer BM2 may be formed to have a thickness of about 1 μm or more and about 3 μm or less, and the horizontal gap Gap2 between the pixel defining layer PDL and the upper light blocking layer BM2 may have a value of about 6 μm or more and about 8.5 μm or less.

Due to the upper light blocking layer BM2 as described above, scattering and reflection of external light generated at the overlapping portion of the color filters CF1, CF2, and CF3 may be reduced, and accordingly, a reflection diffraction pattern may be reduced, and visibility of reflection and diffraction may be reduced.

Hereinafter, the relationship between the reflection characteristic of external light and the thickness of the upper light blocking layer BM2 will be described with respect to FIG. 15.

FIG. 15 illustrates a table comparing reflection characteristics of emissive display devices according to a comparative example and an example.

FIG. 15 illustrates Examples 1 and 3 along with Comparative Example 1 not including the upper light blocking layer. FIG. 15 also illustrates an example in which a thickness of the upper light blocking layer BM2 is thicker by about 0.2 μm in Examples 1 and 3. In FIG. 15, the thickness of the upper light blocking layer BM2 was about 0.8 μm in Examples 1 and 3, and the thickness of the upper light blocking layer BM2 was about 1.0 μm in the example in which the thickness was increased.

Referring to FIG. 15, it may be seen that compared to Comparative Example 1, all examples have advantages in that reflection diffraction patterns due to reflection of external light are reduced and reflection diffraction visibility is also lowered.

In the embodiment, it may be seen that the reflection diffraction pattern according to the reflection of external light is reduced as the thickness of the upper light blocking layer BM2 increases, resulting in that the reflection of external light is reduced as the thickness of the upper light blocking layer BM2 increases. In Example 3, it may be seen that since only the upper light blocking layer BM2 is formed, the reflection diffraction pattern of external light is relatively clear in case that the upper light blocking layer BM2 is formed as thin as about 0.8 μm. Accordingly, in the embodiment in which the lower light blocking layer BM is not formed, the upper light blocking layer BM2 may have a thickness of about 1 μm or more in order to reduce the improved reflection characteristic of external light.

Hereinafter, a cross-sectional structure of another embodiment will be described with respect to FIG. 16.

Figure 16:
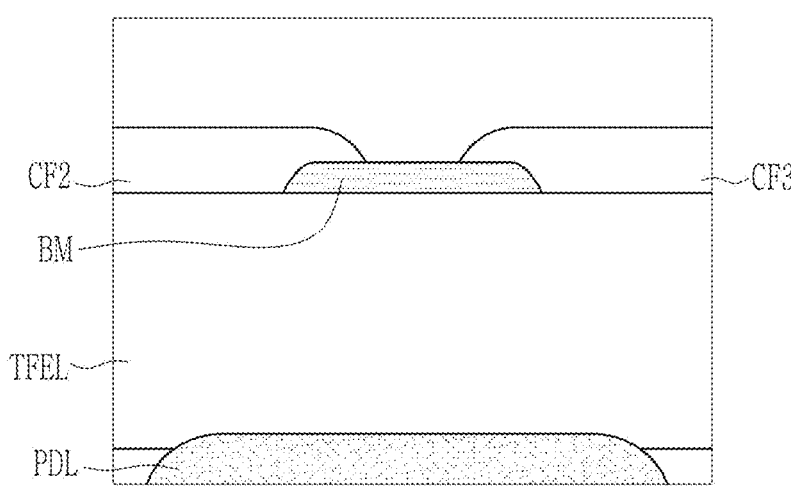
FIG. 16 illustrates a schematic enlarged cross-sectional view illustrating a positional relationship of a pixel defining layer, a color filter, and a light blocking layer in an emissive display device according to another embodiment.
Figure 16:
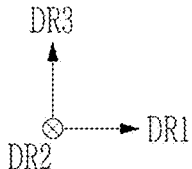

FIG. 16 illustrates a schematic enlarged cross-sectional view illustrating a positional relationship of a pixel defining layer, a color filter, and a light blocking layer in an emissive display device according to another embodiment.

In the embodiment of FIG. 16, the color filters CF2 and CF3 may be spaced apart from each other at regular intervals so as not to overlap each other. As a result, reflection of external light generated at the overlapping portion of the color filters CF2 and CF3 may not occur. Accordingly, in FIG. 16, the upper light blocking layer may not be separately formed, and only the lower light blocking layer BM may be formed. The lower light blocking layer BM may be formed to have a thickness of about 1 μm or more and about 3 μm or less, and the horizontal gap Gap1 between the pixel defining layer PDL and the lower light blocking layer BM may have a value of about 3 μm or more and about 6.8 μm or less. The thickness of the lower light blocking layer BM formed in the embodiment of FIG. 16 may be larger than that in the embodiment in which the upper light blocking layer BM2 is formed, so that a light blocking characteristic may be enhanced. In the embodiment of FIG. 16, an interval between adjacent color filters CF2 and CF3 may be greater than about 0 and less than or equal to about 3 μm.

In the embodiment of FIG. 16, since there is no overlapping portion of the color filter, external light is not scattered and reflected at an overlapping portion with the color filter, thereby reducing a scattering and reflection value and reducing a reflection diffraction pattern.

Hereinafter, variations in scattering and reflection (SCI) according to color filters positioned at an uppermost side among color filters of different colors will be described with respect to FIGS. 17 and 18.

Figure 17:
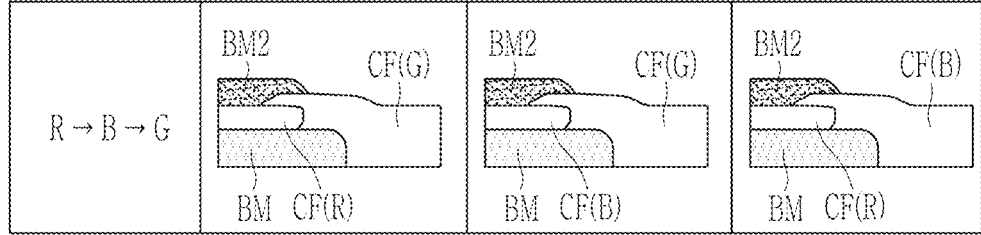

FIGS. 17 and 18 each illustrate a comparison of differences in reflection characteristics depending on a stacked order of color filters in an emissive display device according to an embodiment.

First, referring to FIG. 17, a stacked order of the color filters used in the embodiment and a resulting stacked structure will be described.

According to a leftmost column of FIG. 17, it is illustrated that a stacked order of a red color filter CF(R), a green color filter CF(G), and a blue color filter CF(B) used in an emissive display device is the red color filter CF(R), the blue color filter CF(B), and the green color filter CF(G).

In case that the red color filter CF(R), the blue color filter CF(B), and the green color filter CF(G) are stacked each other in order, structures of the color filters positioned between the lower light blocking layer BM and the upper light blocking layer BM2 may be as illustrated in three columns on the right.

A reason why the green color filter CF(G) is formed last may be that the scattering and reflection (SCI) is the least, which will be described with respect to FIG. 18.

In FIG. 18, reflectance of two examples in which the red color filter CF(R), the green color filter CF(G), and the blue color filter CF(B) are stacked each other in an order of the red color filter CF(R), the green color filter CF(G), and the blue color filter CF(B) and two examples in which the red color filter CF(R), the blue color filter CF(B), and the green color filter CF(G) are stacked each other in an order of the red color filter CF(R), the blue color filter CF(B), and the green color filter CF(G), as in the example illustrated in FIG. 17, is compared and shown. In FIG. 18, total reflectance (SCE) is also described in addition to the scattering and reflection (SCI), and the total reflectance (SCE) may further include specular reflection in addition to the scattering and reflection (SCI).

In numerical values described in a right column of FIG. 18, a numerical value on the left of the arrow indicates a reflectance value of the example in which the red color filter CF(R), the green color filter CF(G), and the blue color filter CF(B) are stacked each other in order, and as in the example of FIG. 17, a numerical value on the right of the arrow indicates a reflectance value of the example in which the red color filter CF(R), the blue color filter CF(B), and the green color filter CF(G) are sequentially stacked each other.

According to the numerical values described in FIG. 18, as in the example of FIG. 17, it may be seen that the scattering and reflectance (SCI) is reduced by about 0.04% or about 0.06% in the example in which the red color filter CF(R), the blue color filter CF(B), and the green color filter CF(G) are sequentially stacked each other, and accordingly, it may be described that the total reflectance (SCE) is also reduced by about 0.04% to about 0.06%. Accordingly, as in the example illustrated in FIG. 17, the scattering and reflection (SCI) of external light may be reduced by at least about 0.04% by stacking the red color filter CF(R), the blue color filter CF(B), and the green color filter CF(G) each other in this order, and thus in the emissive display according to the embodiment, the green color filter CF(G) may be formed by being stacked last.

In FIG. 18, an example in which the red color filter CF(R) is formed last is not illustrated because the red color filter CF(R) generally has high reflectance among three colors.

Hereinafter, another modification of the embodiment of FIG. 7 will be described with reference to FIGS. 19 and 20.

Figure 19:
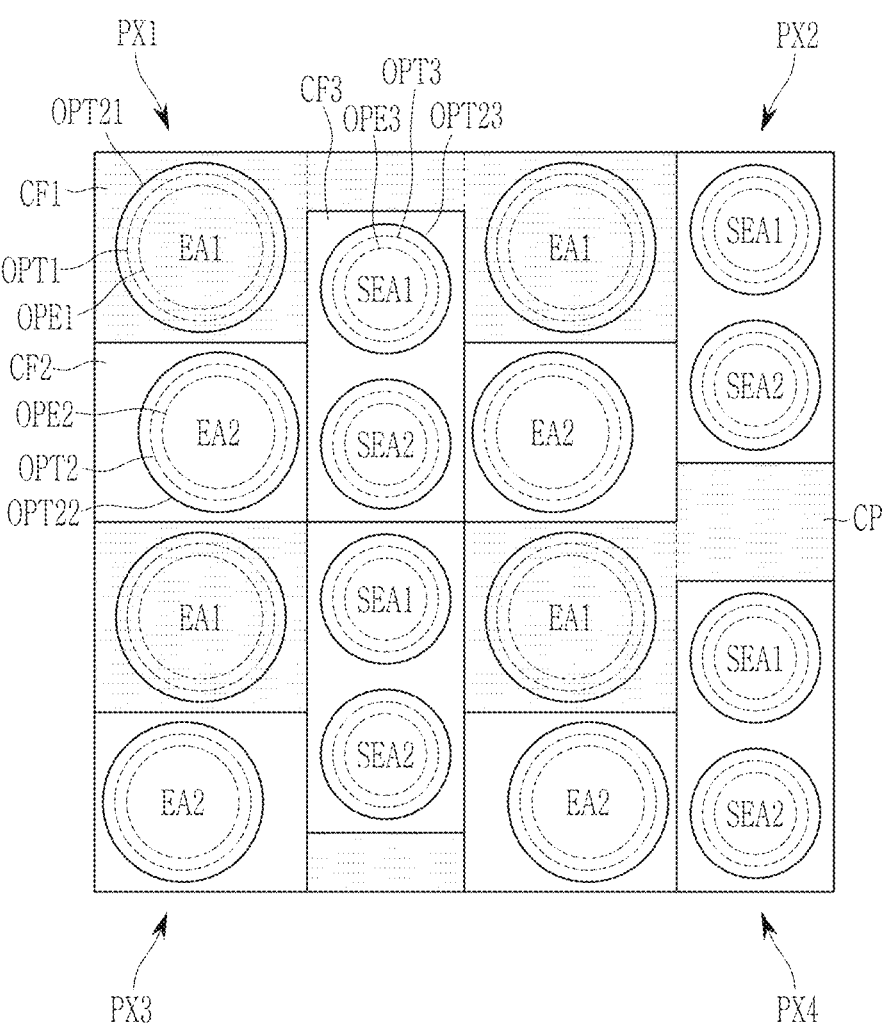
FIG. 19 and FIG. 20 each illustrate a plan view illustrating a disposition of an emission area, a color filter, and a light blocking layer in a display area of an emissive display device according to another embodiment.
Figure 19:
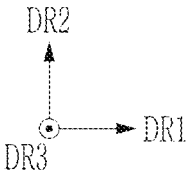
Figure 20:
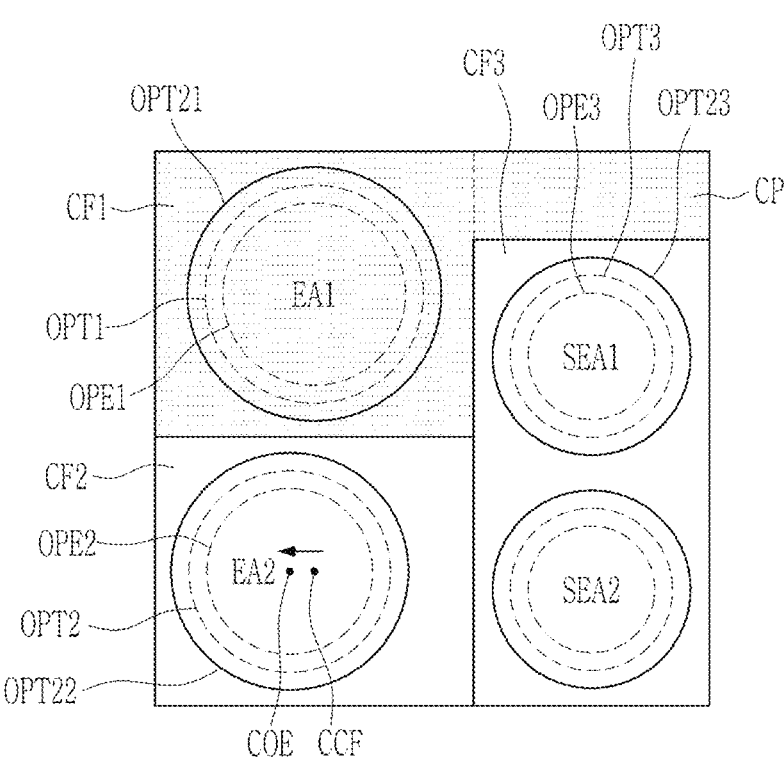
Figure 20:
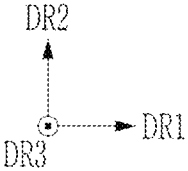

FIGS. 19 and 20 each illustrate a schematic plan view illustrating a disposition of an emission area, a color filter, and a light blocking layer in a display area of an emissive display device according to another embodiment.

FIG. 20 illustrates a schematic enlarged view of a portion of FIG. 19. Referring to FIGS. 19 and 20, in the emissive display device 10 according to an embodiment, the emission areas EA1, EA2, and EA3 may overlap the color filters CF1, CF2, and CF3, and as illustrated in FIG. 20, an example in which centers COE of the emission areas EA1, EA2, and EA3 do not coincide with centers CCF of the color filters CF1, CF2, and CF3 is shown.

Light reflected from the emission areas EA1, EA2, and EA3 and diffracted may interfere with light reflected and diffracted from other emission areas EA1, EA2, and EA3, and thus may be recognized as a specific pattern. Accordingly, interference of lights reflected and diffracted from other adjacent emission areas EA1, EA2, and EA3 may be weakened by shifting positions of the emission areas EA1, EA2, and EA3 based on the color filters CF1, CF2, and CF3.

FIGS. 19 and 20 each illustrate a case in which a position of the second emission area EA2 is shifted in a reverse direction of the first direction DR1 based on the second color filter CF2. The second emission area EA2 may be positioned at a location where the center COE is moved in a specific direction from the center CCF of the second color filter CF2, and a shift direction or degree of the emission areas EA1, EA2, EA3, and EA4 may be different for each of the unit pixels PX1, PX2, PX3, and PX4. For example, in the first pixel PX1, the center COE of the second emission area EA2 may be shifted from the center CCF of the second color filter CF2 to a right side in the first direction DR1, and in the third unit pixel PX3, the center COE of the second emission area EA2 may be shifted from the center CCF of the second color filter CF2 to a left side, which is opposite to the first direction DR1. In the second unit pixel PX2, the center COE of the second emission area EA2 may be shifted from the center CCF of the second color filter CF2 in the opposite direction of the first direction DR1, and in the fourth unit pixel PX4, the center COE of the second emission area EA2 may shift from the center CCF of the second color filter CF2 in the first direction DR1. Accordingly, light reflected and diffracted from the second emission area EA2 of the different pixels PX1, PX2, PX3, and PX4 may hardly interfere with each other, and in a diffraction pattern of reflected and diffracted light, intensity of green light may be weakened. Correspondingly, areas of the first emission area EA1 and the third emission area EA3 may be partially adjusted such that a color of the diffraction pattern becomes white.

Although not illustrated in the drawing, positions of the subemission areas SEA1 and SEA2 of the first emission area EA1 and the third emission area EA3 may be shifted based on the color filters CF1, CF2, and CF3, respectively, in addition to the second emission area EA2. The shifted direction may also be an oblique direction having a constant angle with respect to the first direction DR1. The emissive display device 10 according to an embodiment may shift the emission areas EA1, EA2, and EA3 to control a color and intensity of the diffraction pattern of reflected light.

Referring to FIG. 6, a touch sensing portion of the emissive display device is not separately illustrated. Accordingly, a modification in which a touch sensing part for sensing a touch is included will be described below with respect to FIGS. 21 and 22.

Figure 21:
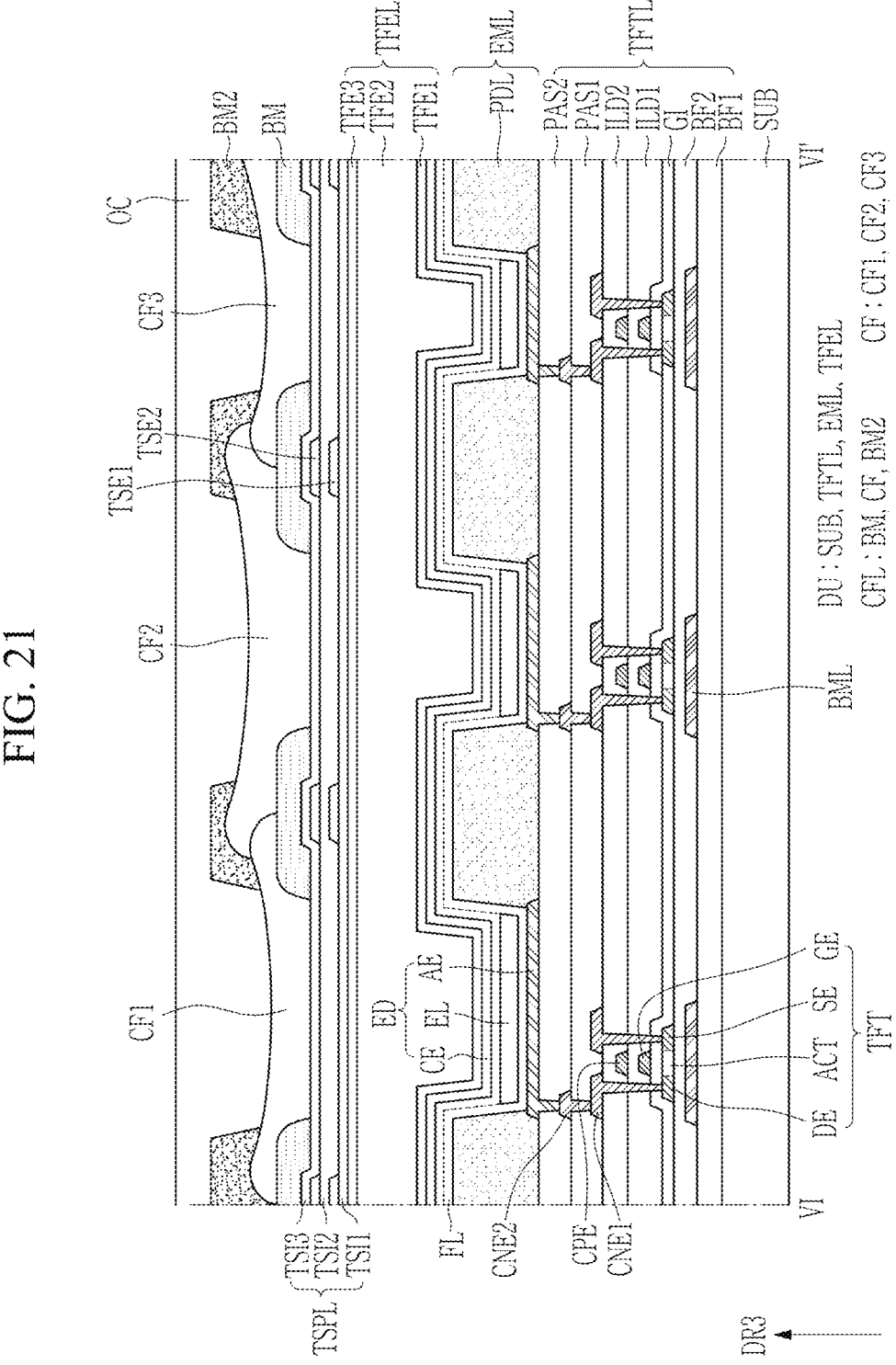
FIG. 21 and FIG. 22 each illustrate a schematic cross-sectional view of an emissive display device according to another embodiment.

FIGS. 21 and 22 each illustrate a schematic cross-sectional view of an emissive display device according to another embodiment.

First, referring to FIG. 21, unlike in the embodiment of FIG. 6, a touch sensing part that senses a touch may be a touch sensing layer TSPL, and may be positioned between the encapsulation layer TFEL and the external light reducing layer CFL. A structure of the embodiment of FIG. 21 other than the touch sensing layer TSPL may be the same as that of the embodiment of FIG. 6.

The touch sensing layer TSPL may be positioned between the encapsulation layer TFEL and the lower light blocking layer BM, and may include a sensing electrode overlapping the lower light blocking layer BM in a plan view and a sensing insulating layer positioned on at least one side of the sensing electrode.

In the embodiment of FIG. 21, in detail, the touch sensing layer TSPL may include sensing insulating layers TSI1, TSI2, and TSI3 and sensing electrodes TSE1 and TSE2. In the embodiment of FIG. 21, a touch may be sensed in a capacitive type using the two sensing electrodes TSE1 and TSE2, but according to an embodiment, a touch may be sensed in a self-cap type using only a sensing electrode. The sensing electrodes TSE1 and TSE2 may be insulated from each other with the sensing insulating layers TSI1, TSI2, and TSI3 provided therebetween, and some may be electrically connected through openings positioned in the sensing insulating layers TSI1, TSI2, and TSI3.

The sensing electrodes TSE1 and TSE2 of the touch sensing layer TSPL of FIG. 21 may be electrically connected to the touch driver 400 of FIG. 2. The touch driver 400 may supply a touch driving signal to the sensing electrodes TSE1 and TSE2 of the touch sensing part, and may sense a change in capacitance between the sensing electrodes.

The sensing electrodes TSE1 and TSE2 may include a metal such as aluminum (Al), copper (Cu), silver (Ag), gold (Au), molybdenum (Mo), titanium (Ti), and tantalum (Ta), or the like or a metal alloy thereof, and may be formed as a single layer or a multilayer. In the embodiment, the lower sensing insulating layer TSE1 may be positioned below the lower sensing electrode TSI1, the intermediate sensing insulating layer TSI2 maybe positioned between the lower sensing electrode TSE1 and the upper sensing electrode TSE2, and the upper sensing insulating layer TSI3 may be positioned between the upper sensing electrode TSE2 and the lower light blocking layer BM. The upper sensing insulating layer TSI3 may also be positioned under the color filters CF1, CF2, and CF3.

The upper sensing electrode TSE2 may be covered by the lower light blocking layer BM, and the sensing electrodes TSE1 and TSE2 may overlap the lower light blocking layer BM and the upper light blocking layer BM2 in a plan view.

According to another embodiment, as illustrated in FIG. 22, a touch sensing part TSP that senses a touch may be included in the cover window WIN positioned on the planarization layer OC.

The embodiment of FIG. 22 and the embodiment of FIG. 6 may have a same structure below the planarization layer OC, and the embodiment of FIG. 22 may be different from the embodiment of FIG. 6 at least in that the cover window WIN may be formed on the planarization layer OC. In the embodiment of FIG. 22, the touch sensing part TSP capable of sensing a touch may be included in a lower portion of (or below) the cover window WIN to detect a position touched by a user's hand or the like.

The cover window WIN may be attached to the planarization layer OC by an adhesive.

The touch sensing part TSP included in the cover window WIN may sense a touch by being electrically connected to the touch driver 400 of FIG. 2 or electrically connected to a separate driver that drives the electronic device 1.

FIGS. 21 and 22 do not illustrate a polarizer because the display devices according to embodiments may not have the polarizer. However, a polarizer may be disposed on an upper surface of the emissive display device.

The above description is an example of technical features of the disclosure, and those skilled in the art to which the disclosure pertains will be able to make various modifications and variations. Thus, the embodiments of the disclosure described above may be implemented separately or in combination with each other.

The embodiments disclosed in the disclosure are intended not to limit the technical spirit of the disclosure but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:

1. A display device comprising:
a first electrode disposed on a substrate;
a pixel defining layer that has an opening exposing the first electrode;
a second electrode disposed on the pixel defining layer and the first electrode;
an encapsulation layer that covers the second electrode;
a color filter disposed on the encapsulation layer;
an upper light blocking layer that has an upper opening corresponding to the color filter;
a lower light blocking layer disposed on the encapsulation layer and having a lower opening, wherein
the upper light blocking layer overlaps an overlapping portion where adjacent color filters overlap each other in a plan view,
a horizontal distance between the pixel defining layer and the upper light blocking layer is in a range of about 6 μm to about 8.5 μm, and
the lower opening is filled by a respective one of the color filters.

2. The display device of claim 1,
wherein
a horizontal distance between the lower light blocking layer and the upper light blocking layer is in a range of about 1.7 μm to about 3 μm.

3. The display device of claim 2, wherein
the lower opening has a smaller area than the upper opening.

4. The display device of claim 3, wherein
the upper light blocking layer has a thickness in a range of about 1 μm to about 3 μm, and
the lower light blocking layer has a thickness of about 1 μm to about 1.5 μm.

5. The display device of claim 4, wherein
a horizontal distance between the pixel defining layer and the lower light blocking layer is in a range of about 3 μm to about 6.8 μm.

6. The display device of claim 4, wherein
the lower opening and the upper opening each have a circular shape.

7. The display device of claim 4, wherein
the upper light blocking layer is formed along the overlapping portion where the adjacent color filters overlap each other in a plan view.

8. The display device of claim 7, wherein
the upper light blocking layer has a constant width.

9. A display device comprising:
a first electrode disposed on a substrate;
a pixel defining layer that has an opening exposing the first electrode;
a second electrode disposed on the pixel defining layer and the first electrode;
an encapsulation layer that covers the second electrode;
a lower light blocking layer disposed on the encapsulation layer and having a lower opening; and
a color filter that fills the lower opening, wherein
adjacent color filters do not overlap each other in a plan view and are spaced apart at regular intervals, and
a horizontal distance between the pixel defining layer and the lower light blocking layer is in a range of about 3 μm to about 6.8 μm.

10. The display device of claim 9, wherein
portions at which the adjacent color filters spaced apart at the regular intervals overlap the lower light blocking layer in a plan view.

11. The display device of claim 10, wherein
the lower light blocking layer has a thickness in a range of about 1 μm to about 3 μm.

12. An electronic device comprising:
a housing that has a rear surface and a side surface;
a cover window disposed at an upper portion of the housing; and
a display panel disposed at a lower portion of the cover window and including a display area, wherein
the display panel includes:
    a first electrode disposed on a substrate;
    a pixel defining layer that has an opening exposing the first electrode;
    a second electrode disposed on the pixel defining layer and the first electrode;
    an encapsulation layer that covers the second electrode;

a lower light blocking layer disposed on the encapsulation layer and having a lower opening;
    a color filter that fills the lower opening; and
    an upper light blocking layer that has an upper opening corresponding to the color filter,
a horizontal distance between the lower light blocking layer and the upper light blocking layer is in a range of about 1.7 μm to about 3 μm.

13. The electronic device of claim 12, wherein
a horizontal distance between the pixel defining layer and the upper light blocking layer is in a range of about 6 μm to about 8.5 μm, and
a horizontal distance between the pixel defining layer and the lower light blocking layer is in a range of about 3 μm to about 6.8 μm.

14. The electronic device of claim 13, wherein
the lower opening has a smaller area than the upper opening.

15. The electronic device of claim 14, wherein
the upper light blocking layer has a thickness in a range of about 1 μm to about 3 μm, and
the lower light blocking layer has a thickness in a range of about 1 μm to about 1.5 μm.

16. The electronic device of claim 15, wherein
the lower opening and the upper opening each have a circular shape.

17. The electronic device of claim 15, wherein
the upper opening is formed along an overlapping portion where adjacent color filters overlap in a plan view.

18. The electronic device of claim 17, wherein
the upper opening has a constant width.

19. The electronic device of claim 13, wherein
a polarizer is not disposed on a front surface of the display panel.

20. The electronic device of claim 13, wherein the display panel includes:
a sensing electrode disposed between the encapsulation layer and the lower light blocking layer and overlapping the lower light blocking layer in a plan view; and
a touch sensing layer that includes a sensing insulating layer disposed on at least one side of the sensing electrode.

* * * * *